United States Patent [19]
Umezawa et al.

[11] Patent Number: 6,108,246
[45] Date of Patent: Aug. 22, 2000

[54] SEMICONDUCTOR MEMORY DEVICE

[75] Inventors: Akira Umezawa; Hitoshi Shiga, both of Yokohama; Hironori Banba, Kamakura; Shigeru Atsumi, Yokohama, all of Japan

[73] Assignee: Kabushiki Kaisha Toshiba, Kawasaki, Japan

[21] Appl. No.: 09/391,153

[22] Filed: Sep. 8, 1999

[30] Foreign Application Priority Data

Sep. 8, 1998 [JP] Japan ................................. 10-253995

[51] Int. Cl.$^7$ .................................................. G11C 11/40
[52] U.S. Cl. ............... 365/189.09; 365/226; 365/185.24; 365/185.2; 365/185.18; 365/185.25; 365/204; 365/200
[58] Field of Search ....................... 365/189.01, 189.09, 365/200, 226, 204, 185.18, 185.2, 185.24, 185.25

[56] References Cited

U.S. PATENT DOCUMENTS

| | | | |
|---|---|---|---|
| 5,485,425 | 1/1996 | Iwai et al. | 365/200 |
| 5,579,256 | 11/1996 | Kajigaya et al. | 365/51 |
| 5,881,014 | 3/1999 | Ooishi | 365/226 |
| 5,909,398 | 6/1999 | Tanzawa et al. | 365/185.29 |

FOREIGN PATENT DOCUMENTS 2-116084  4/1990  Japan .

*Primary Examiner*—Viet Q. Nguyen
*Attorney, Agent, or Firm*—Banner & Witcoff, Ltd.

[57] ABSTRACT

A nonvolatile memory semiconductor memory device is disclosed which incorporates fuse-cells in which data for setting a mode and redundancy data are stored. The nonvolatile memory semiconductor memory device incorporates a fuse-cell circuit including fuse-cells, a fuse-cell controlling circuit for reading data stored in the fuse-cell, a voltage boosting circuit for generating a boosted voltage and a voltage converting circuit which uses a reference voltage to convert the boosted voltage into read voltage for use when data is read from the fuse-cell. The reference voltage is generated by using a threshold voltage of a reference cell having the same structure as that of the fuse-cell.

18 Claims, 17 Drawing Sheets

SEMICONDUCTOR MEMORY DEVICE

BACKGROUND OF THE INVENTION

The present invention relates to a semiconductor memory device incorporating fuse-cells in which data for setting a mode corresponding to a plurality of types of products and redundancy data or the like for use in a redundancy technique is stored.

A semiconductor memory device arranged to cause data for setting a mode corresponding of a plurality of types, for example, data for changing the number of bits of an I/O, to be stored in a nonvolatile memory cells so that change in the number of bits of the I/O is permitted has been disclosed in Jpn. Pat. Appln. KOKAI Publication No. 2-116084, Jpn. Pat. Appln. KOKAI Publication No. 2-243677 and so forth.

Recently also redundancy data for use in an operation for substituting a spare column/row for a defective column/row, that is, in a so-called redundancy technique is stored in a nonvolatile memory cells in place of the fuse. The foregoing technique has been put into practical use. In this specification, the nonvolatile memory cell in which data for setting a mode and redundancy data is stored is called a "fuse-cell".

Data stored in the fuse-cell is data for determining the type of a product and data for changing a defective column/row into a spare column/row. The above-mentioned data must be read/latched before an apparatus is usually operated. Therefore, a semiconductor memory device incorporating fuse-cells has a circuit for performing read/latch of data from a fuse-cell before the usual operation is started. The structure of a circuit system for performing read/latch data is shown in FIG. 1. Main signals or voltage waveforms are shown in FIG. 2. The structure and the operation of the foregoing circuit system will now be described.

Signal PONRST shown in FIG. 2 is a power-on resetting signal. The signal PONRST is made to be "L" level when the potential of external power supply Vdd is raised from 0V to power supply detection level VPONRST (2V or lower). Thus, supply of electric power can be detected.

Signal PONRST' is one of power-on reset signals. The difference from the signal PONRST will now be described. The signal PONRST is made to be "L" level when the external power supply Vdd is raised to the detection level VPONRST. On the other hand, the signal PONRST' is made to be "L" level after the external power supply Vdd is raised to a stable level (3V or lower). That is, the signal PONRST' is a signal indicating that the external power supply Vdd is raised to the stable level.

A voltage boosting circuit 201 shown in FIG. 1 is activated when the signal PONRST' is made to be the "L" level to boost the external power supply Vdd to boosted voltage VDDP having a predetermined level (6.5V or lower). The boosted voltage VDDP is supplied to a voltage converting circuit 202. The boosted voltage VDDP is converted into read voltage VDDR by the voltage converting circuit 202.

The voltage converting circuit 202 incorporates a VDDR regulator (not shown) for regulating the boosted voltage VDDP to the read voltage VDDR having a predetermined level (4.8V or lower); and a VDDR detector (not shown) for detecting whether or not the level of the read voltage VDDR is a predetermined level.

The VDDR regulator (not shown) uses reference voltage Vref to regulate the boosted voltage VDDP to the read voltage VDDR having a predetermined level.

The VDDR detector (not shown) uses the reference voltage Vref to output signal SVDDR for detecting whether or not the read voltage VDDR is raised to a predetermined level. The signal SVDDR is made to be "H" level when the read voltage VDDR is raised to the predetermined level. The signal SVDDR is supplied to a fuse-cell controlling circuit 203.

The fuse-cell controlling circuit 203 is activated when the signal PONRST' is made to be "L" level. When the signal SVDDR is made to be "H" level, the fuse-cell controlling circuit 203 executes a data read/latch sequence with respect to fuse-cells.

A fuse-cell circuit 204 incorporates a fuse-cell FC; a PMOS P202 serving as a load when data is read from the fuse-cell FC; an NMOS NI201 connected between the fuse-cell FC and the PMOS P202 and arranged to have a threshold voltage which is substantially 0V; a latch circuit for latching data read from the fuse-cell FC during the usual operation of the apparatus; and a connecting circuit TG for establishing the connection between the latch circuit LAT, the PMOS P202 and the NMOS NI201 and a node 241 during execution of the read/latch sequence.

The fuse-cell controlling circuit 203 makes signal FSREAD to be "H" level for a predetermined time when the signal SVDDR is made to be "H" level in a state in which the signal PONRST' is "L" level. The signal FSREAD is supplied to the PMOS P202 and the connecting circuit TG. During a period in which the signal FSREAD is "H" level, each of the PMOS P202 and the connecting circuit TG is brought to a conductive state.

Then, each of signal FSBIAS and signal FSWL is made to be "H" level for a predetermined time. As a result, the potential of the node 241 is changed depending on a fact whether the fuse-cell FC is "ON" or "OFF". The potential of the node 241 is supplied to the input terminal of the connecting circuit TG. The connecting circuit TG supplies an output which is the "H" level or the "L" level to the latch circuit LAT according to the potential of the node 241.

Thus, data stored in the fuse-cell FC is read before the apparatus is operated usually so as to be latched by the latch circuit LAT. The latch circuit LAT outputs latched data FUSE during the usual operation of the apparatus.

The reason why the foregoing fuse-cell controlling circuit 203 is arranged such that the voltage of the signal FSWL is the read voltage VDDR which is higher than the external power supply Vdd will now be described.

The power consumption of the semiconductor memory device has been reduced. At present, the level of the external power supply Vdd is lowered to 3V or lower. When the external power supply vdd is lowered to 3V or lower, the neutral threshold voltage (a state in which ultraviolet rays have been applied to cause electrons to be discharged from a floating gate, the state being hereinafter called a threshold voltage (initial state)) of the fuse-cell FC is sometimes higher than the external power supply Vdd.

In the foregoing case, when one of data items stored in the fuse-cell FC is the threshold voltage (initial state), the fuse-cell FC is undesirably turned off. Thus, correct data cannot be read.

To prevent the foregoing problem, the read voltage VDDR higher than the external power supply Vdd is applied to the gate of the fuse-cell FC. Thus, if the threshold voltage of the fuse-cell FC is the threshold voltage (initial state), the fuse-cell FC can correctly be turned on.

The foregoing read voltage VDDR can be obtained when the voltage converting circuit 202 converts the boosted voltage VDDP into the read voltage VDDR. To convert the boosted voltage VDDP into the read voltage VDDR, reference voltage Vref serving as a reference is required. Referring to FIG. 1, a circuit given reference numeral 205 is a reference-voltage generating circuit for generating the reference voltage Vref.

Hitherto, the reference-voltage generating circuit 205 is a band gap reference circuit which is free from considerable dependency on the power supply voltage and that on the temperature. The band gap reference circuit is operated to generate the reference voltage Vref. Thus, reference voltage Vref having a substantially constant level (1.25V or lower) can be generated regardless of change in the power supply voltage and the temperature.

As described above, the band gap reference circuit has an advantage that the dependency on the power supply voltage and that on the temperature can be reduced. However, if the reference voltage Vref generated by operating the band gap reference circuit is used to convert the boosted voltage VDDP into the read voltage VDDR, the converted read voltage VDDR undesirably has substantially a constant level regardless of change in the power supply voltage and change in the temperature.

On the other hand, the threshold voltage of the fuse-cell FC has dependency on the power supply voltage and that on the temperature. Therefore, if the external power supply Vdd has considerably been changed or if the apparatus is in a hot or cold atmosphere, there arises a problem in that the difference between the read voltage VDDR and the threshold voltage of the fuse-cell FC corresponding to stored data, that is, the margin, is undesirably reduced.

BRIEF SUMMARY OF THE INVENTION

In view of the foregoing, a main object of the present invention is to provide a semiconductor memory device capable of maintaining great difference between a read voltage and a threshold voltage of a fuse-cell corresponding to stored data regardless of change in power supply voltage and that in the temperature.

To achieve the foregoing main object, the semiconductor memory device according to the present invention generates reference voltage for use to convert the read voltage by using a threshold voltage of a device having the same structure as that of the fuse-cell.

The semiconductor memory device having the above-mentioned structure generates the reference voltage by using the threshold voltage of the device having the same structure as that of the fuse-cell. Therefore, the reference voltage is changed owing to change in the power supply voltage and that in the temperature similarly to the threshold voltage of the fuse-cell. When the reference voltage which is changed as described above is used to convert the operating voltage for operating an integrated circuit into the read voltage, the read voltage is changed according to change in the threshold voltage of the fuse-cell.

Since the read voltage is changed according to change in the threshold voltage of the fuse-cell, a great difference between the read voltage and the threshold voltage of the fuse-cell corresponding to stored data can be maintained regardless of change in the power supply voltage and that in the temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
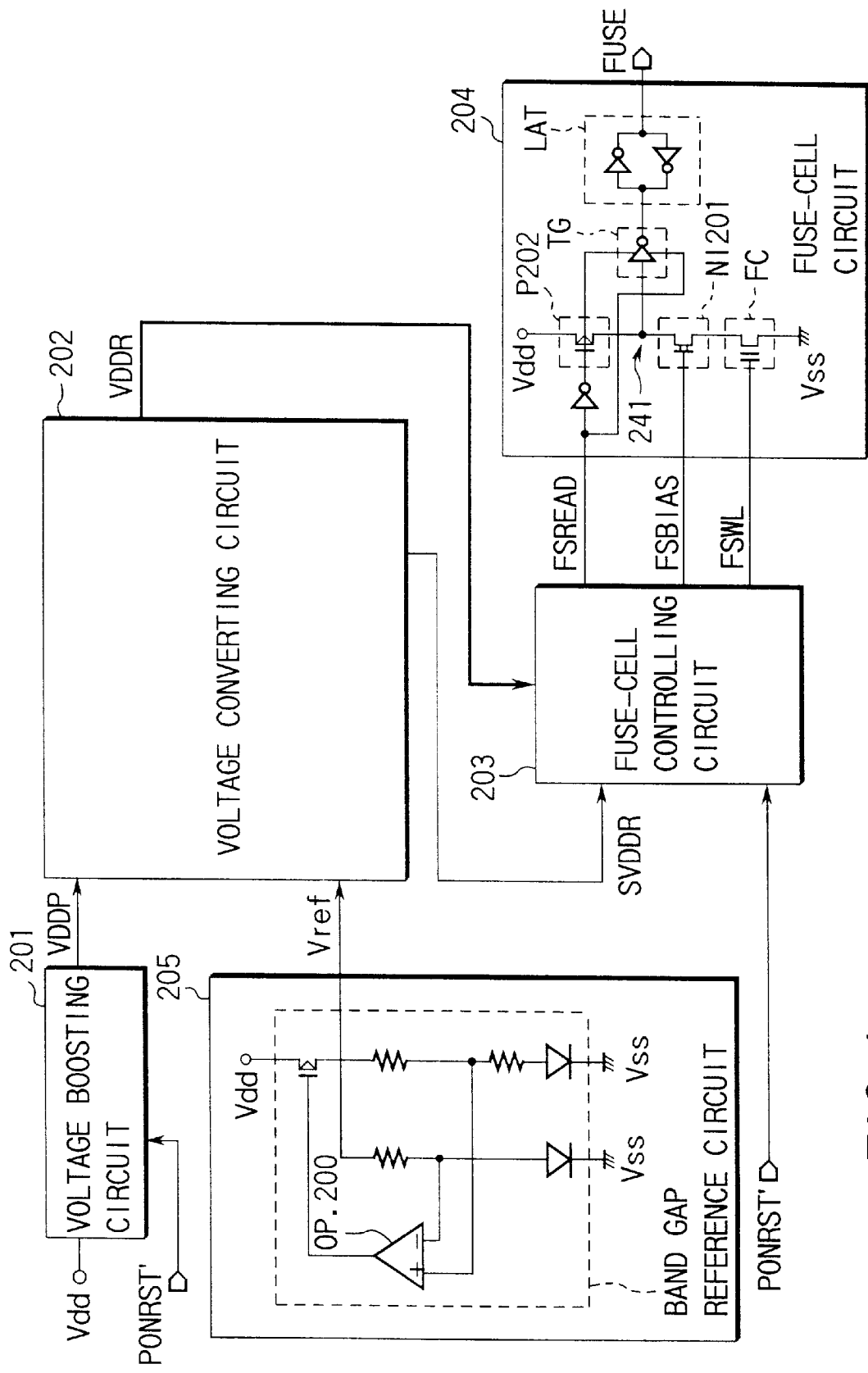
FIG. 1 is a circuit diagram of a conventional circuit.
Figure 2:
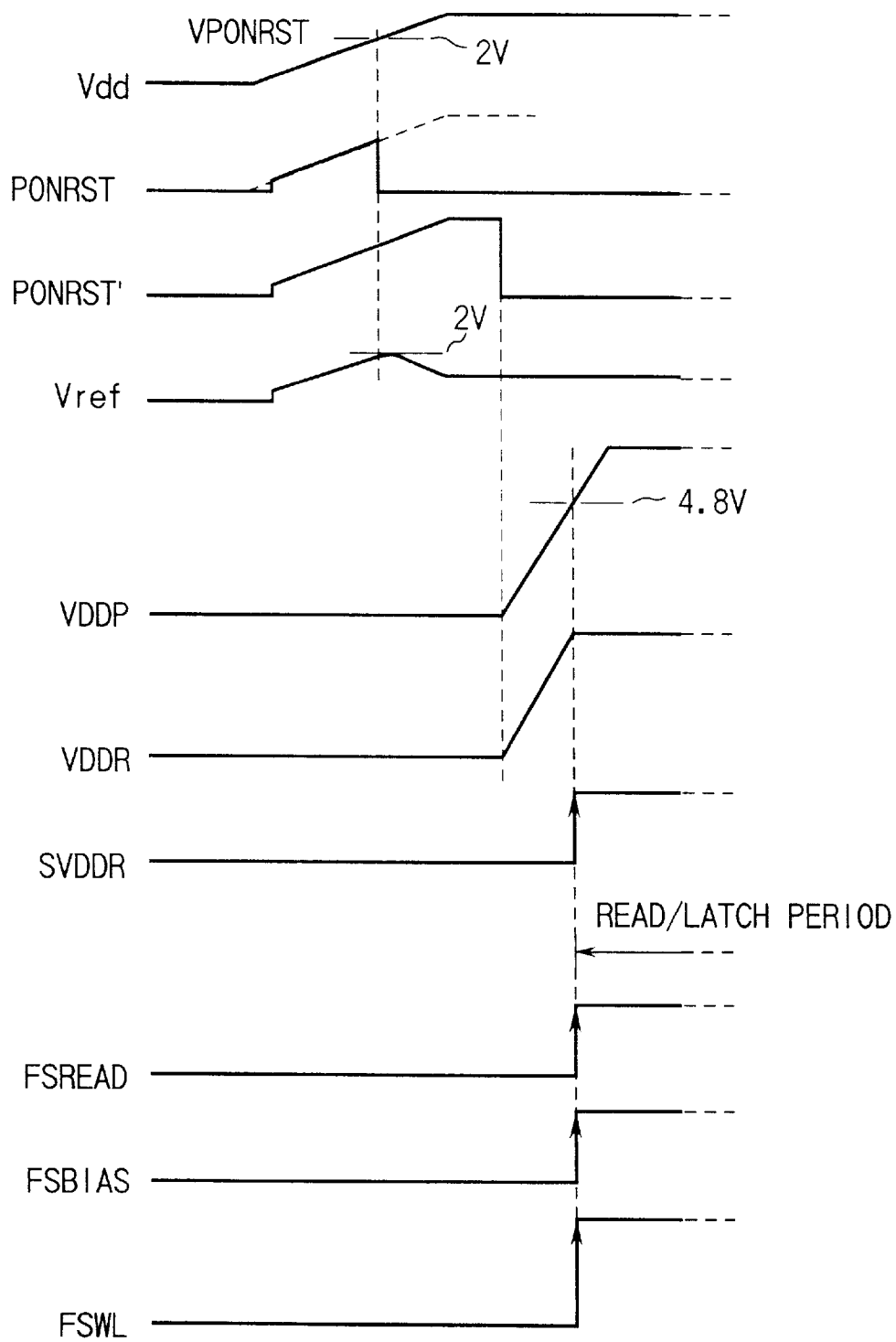
FIG. 2 is a graph showing waveforms of signals to describe the operation of the conventional circuit.

Referring to the drawings, embodiments of the present invention will now be described.

[First Embodiment]

Figure 3:
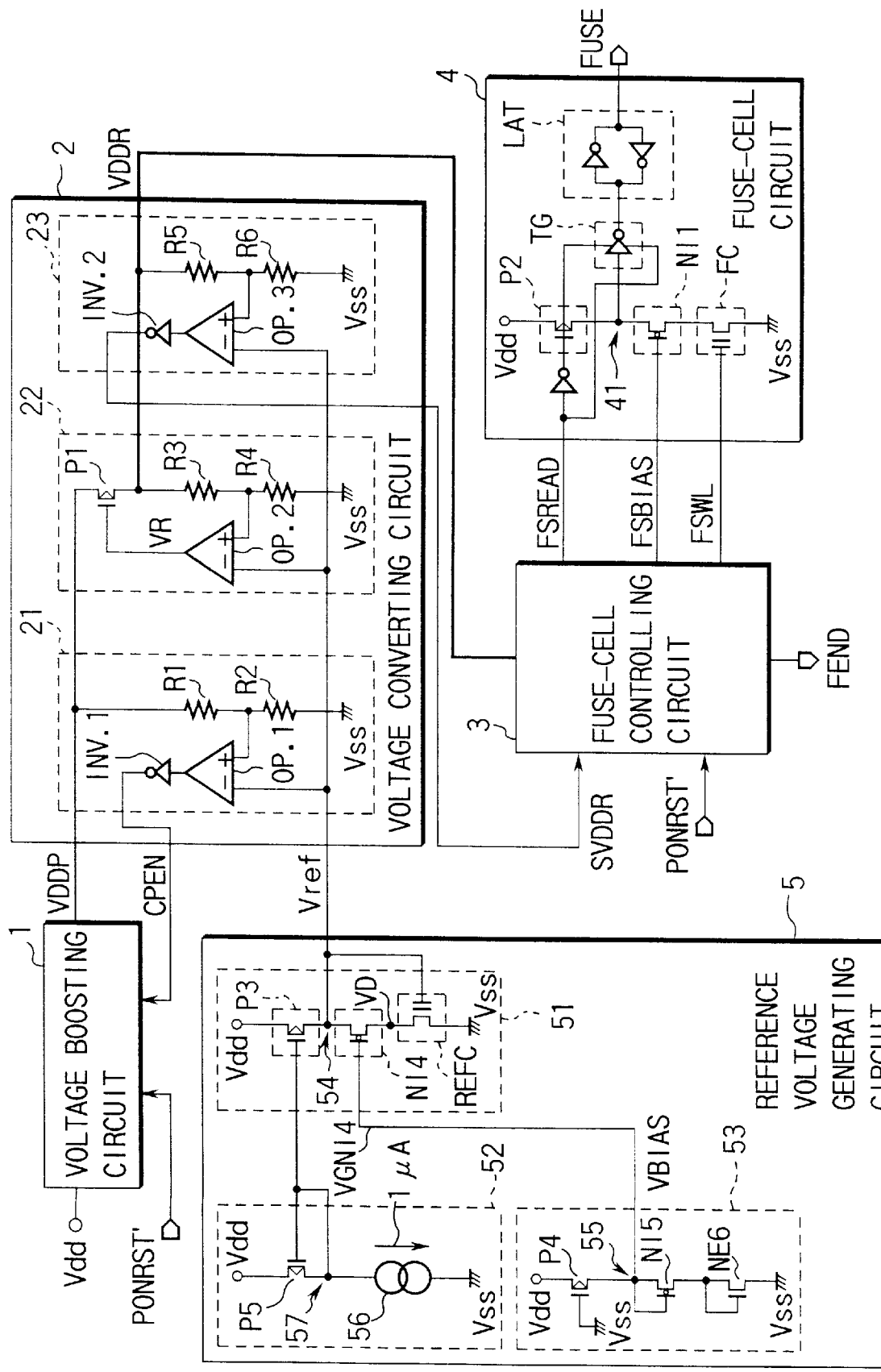
FIG. 3 is a circuit diagram showing a semiconductor memory device according to a first embodiment of the present invention.
Figure 4:
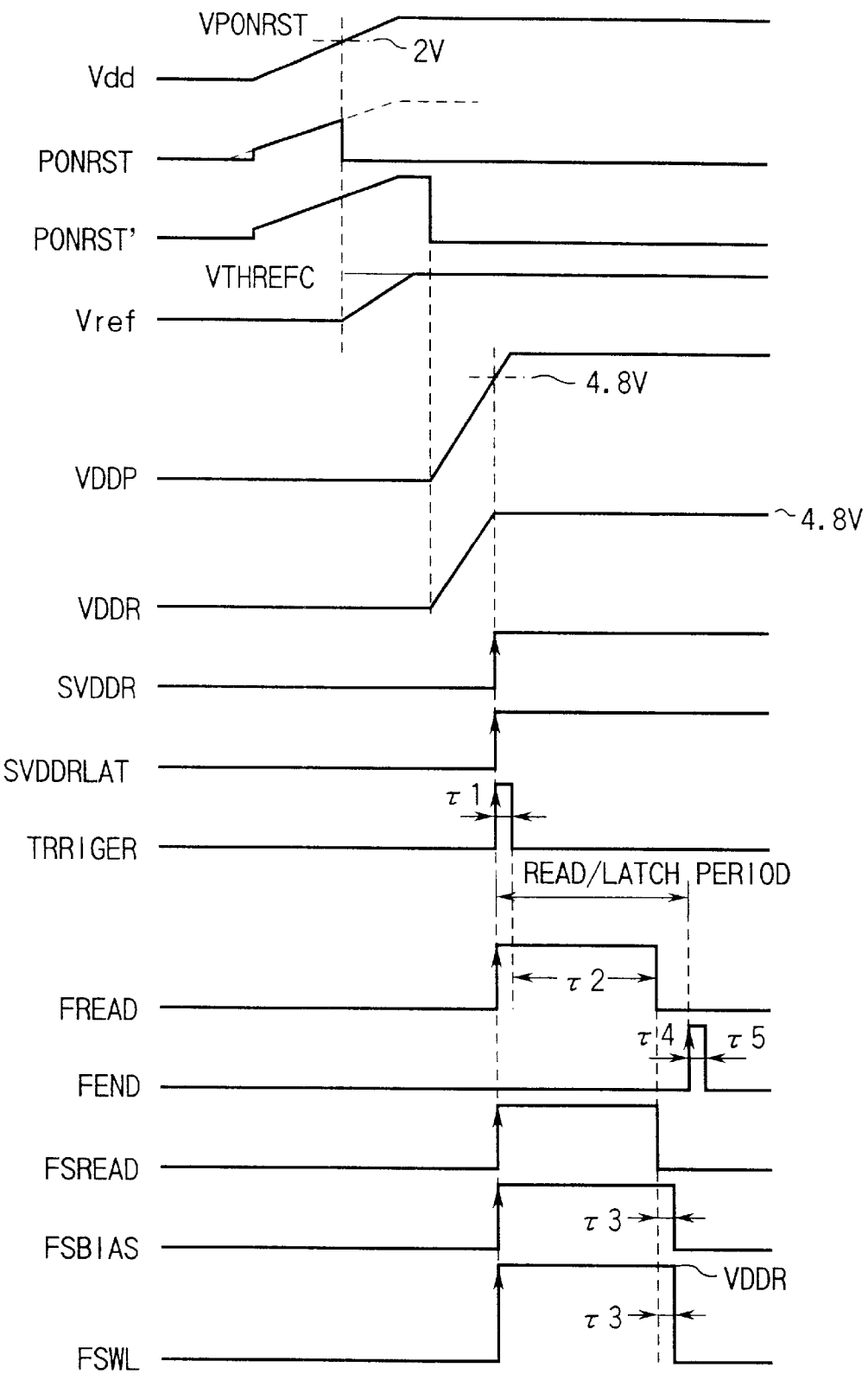
FIG. 4 is a graph showing waveforms of signals to describe the operation of the semiconductor memory device according to the first embodiment of the present invention.

FIG. 3 is a circuit diagram showing the structure of a circuit system for read/latch data from a fuse-cell according to a first embodiment. FIG. 4 is a graph showing main signals or voltage waveforms. The structure and the operation will now be described.

Signal PONRST shown in FIG. 4 is a power-on reset signal. The signal PONRST is made to be "L" level when the potential of external power supply Vdd is raised from 0V to power supply detection level VPONRST (2V or lower). Thus, supply of electric power can be detected.

Signal PONRST' is one of power-on reset signals. The difference from the signal PONRST will now be described. The signal PONRST is made to be "L" level when the external power supply Vdd is raised to the detection level VPONRST. On the other hand, the signal PONRST' is made to be "L" level after the external power supply Vdd is raised to a stable level (3V or lower). That is, the signal PONRST' is a signal indicating a fact that the external power supply Vdd is raised to the stable level.

A voltage boosting circuit 1 shown in FIG. 3 is activated when the signal PONRST' is made to be the "L" level to boost the external power supply Vdd to boosted voltage VDDP having a predetermined level (6.5V or lower). The boosted voltage VDDP is supplied to a voltage converting circuit 2. The boosted voltage VDDP is converted into read voltage VDDR by the voltage converting circuit 2.

The voltage converting circuit 2 incorporates a VDDR detector 21 for detecting whether or not the level of the boosted voltage VDDP is a predetermined level; a VDDR regulator 22 for regulating the boosted voltage VDDP to the read voltage VDDR having a predetermined level (4.8V or lower); and a VDDR detector 23 for detecting whether or not the level of the read voltage VDDR is a predetermined level.

The VDDP detector 21 incorporates differential amplifier (operational amplifier) OP.1. The differential amplifier OP.1 has a positive input terminal (+) which is applied with a voltage obtained by resistance-dividing boosted voltage VDDP by resistors R1 and R2. The differential amplifier OP.1 has a negative input terminal (−) which is applied with reference voltage Vref. Thus, the differential amplifier OP.1 outputs an analog signal for detecting whether or not the boosted voltage VDDP is raised to a predetermined level. The analog signal is inputted to inverter INV.1 so as to be converted into digital signal CPEN for detecting whether or not the boosted voltage VDDP is raised to the predetermined level. The signal CPEN is supplied to the voltage boosting circuit 1.

Figure 5:
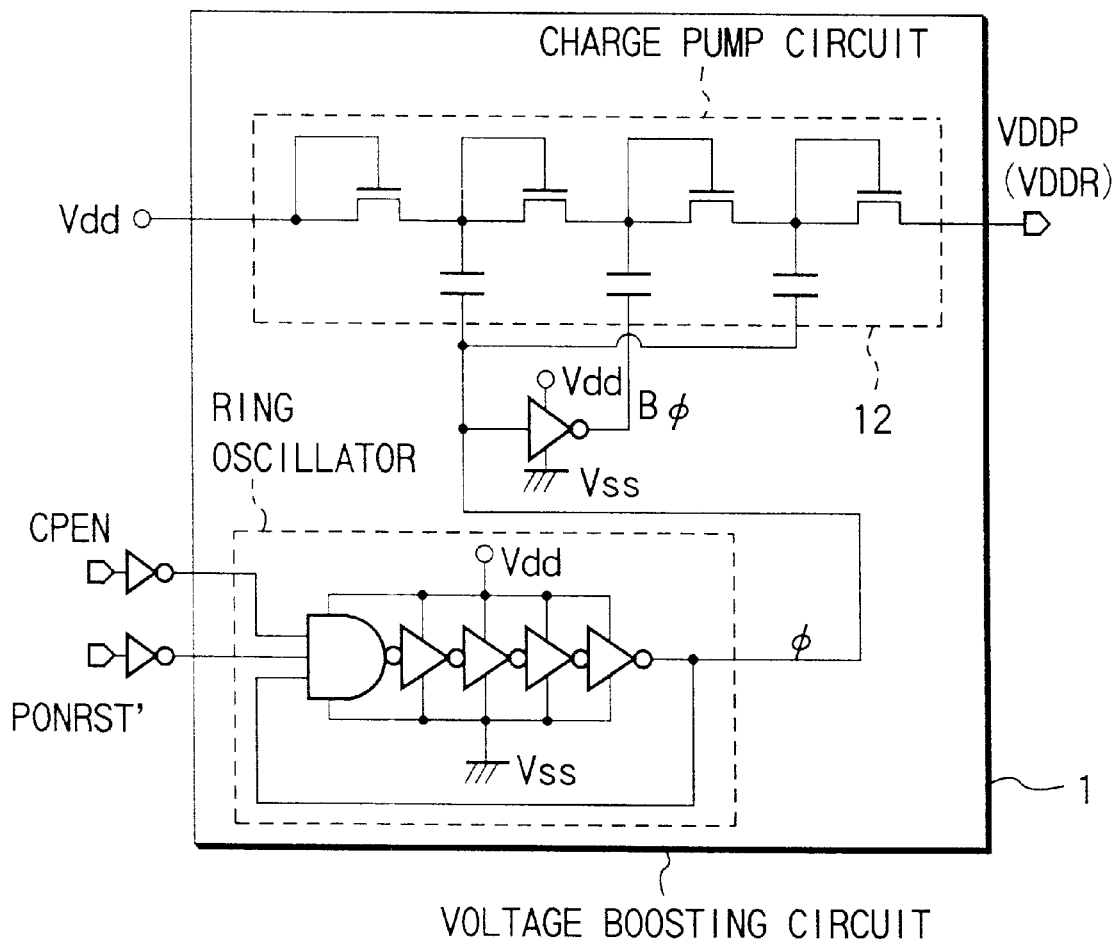
FIG. 5 is a circuit diagram showing an example of a voltage boosting circuit.

FIG. 5 is a circuit diagram showing an example of the structure of the voltage boosting circuit 1.

As shown in FIG. 5, the voltage boosting circuit 1 incorporates a ring oscillator 11 for oscillating oscillated signal φ and a charge pump circuit 12 for boosting the external power supply Vdd to the boosted voltage VDDP in response to the oscillated signal φ. The ring oscillator 11 is activated when the signal PONRST' is made to be "L" level. In a period in which the signal CPEN is "L" level, the ring oscillator 11 outputs the oscillated signal φ. In a period in which the oscillated signal φ is oscillated, the charge pump circuit 12 boosts the external power supply Vdd. The level of the signal CPEN is made to be "L" level in a period in which the boosted voltage VDDP is lower than a predetermined level to operate the ring oscillator 11. When the boosted voltage VDDP is raised to a predetermined level, the CPEN is made to be "H" level to interrupt the operation of the ring oscillator 11. Thus, the predetermined level of the boosted voltage VDDP can be maintained.

The VDDR regulator 22 incorporates a differential amplifier (operational amplifier) OP.2. The differential amplifier OP.2 has a positive input terminal (+) which is applied with voltage obtained by resistance-dividing the boosted voltage VDDP by resistors R3 and R4. The differential amplifier OP.2 has a negative input terminal (−) which is applied with reference voltage Vref. Thus, the differential amplifier OP.2 outputs analog signal VR for regulating the boosted voltage VDDP to the read voltage VDDR having a predetermined level. The analog signal VR is supplied to a gate of PMOS P1 to analog-control the current operation performance of the PMOS P1. As a result, the boosted voltage VDDP is regulated to the read voltage VDDR having the predetermined level.

The VDDR detector 23 incorporates a differential amplifier (operational amplifier) OP.3. The differential amplifier OP.3 has a positive input terminal (+) which is applied with voltage obtained by resistance-dividing read voltage VDDR by resistors R5 and R6. The differential amplifier OP.3 has a negative input terminal (−) which is applied with the reference voltage Vref. Thus, the differential amplifier OP.3 outputs an analog signal for detecting whether or not the read voltage VDDR is raised to a predetermined level. The analog signal is inputted to an inverter INV.2 so as to be converted into a digital signal SVDDR for detecting whether or not the read voltage VDDR is raise to the predetermined level. The signal SVDDR is made to be "H" level when the read voltage VDDR is raised to the predetermined level. The signal SVDDR is supplied to the fuse-cell controlling circuit 3.

The fuse-cell controlling circuit 3 is activated when the signal PONRST' is made to be "L" level. When the signal SVDDR is made to be "H" level, the fuse-cell controlling circuit 3 performs the data read/latch sequence with respect to the fuse-cell.

The fuse-cell circuit 4 incorporates a fuse-cell FC, a PMOS P2 serving as a load when data is read from the fuse-cell FC, an NMOS NI1 connected between the fuse-cell FC and the PMOS P2 and having a threshold voltage which is substantially 0V, a latch circuit LAT for latching data read from the fuse-cell FC during the usual operation of the apparatus and a connecting circuit TG for connecting the latch circuit LAT, the PMOS P2 and the NMOS NI1 and a node 41 with each other during execution of the read/latch sequence.

Figure 6:
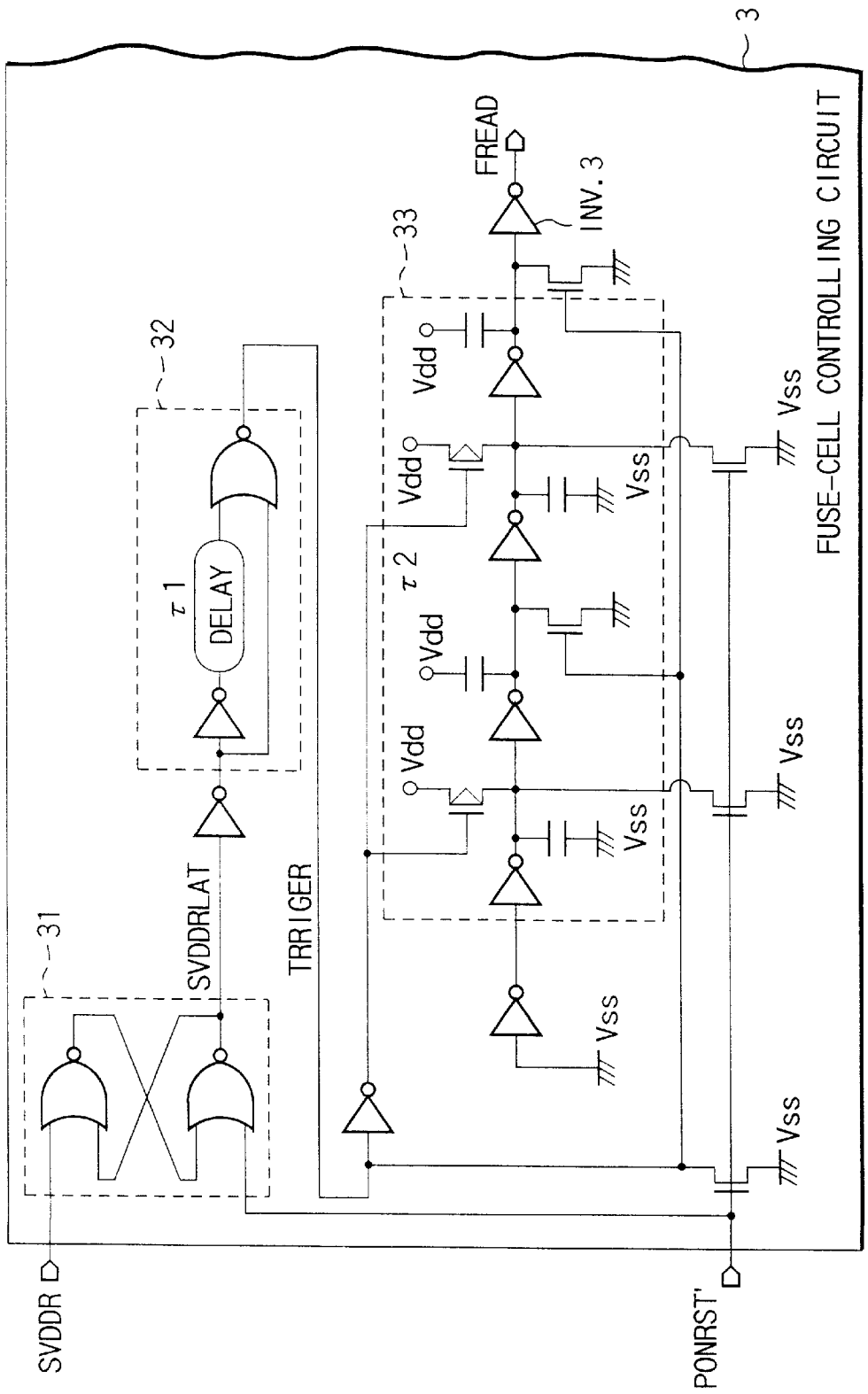
FIG. 6 is a circuit diagram showing an example of a fuse-cell controlling circuit.
Figure 7:
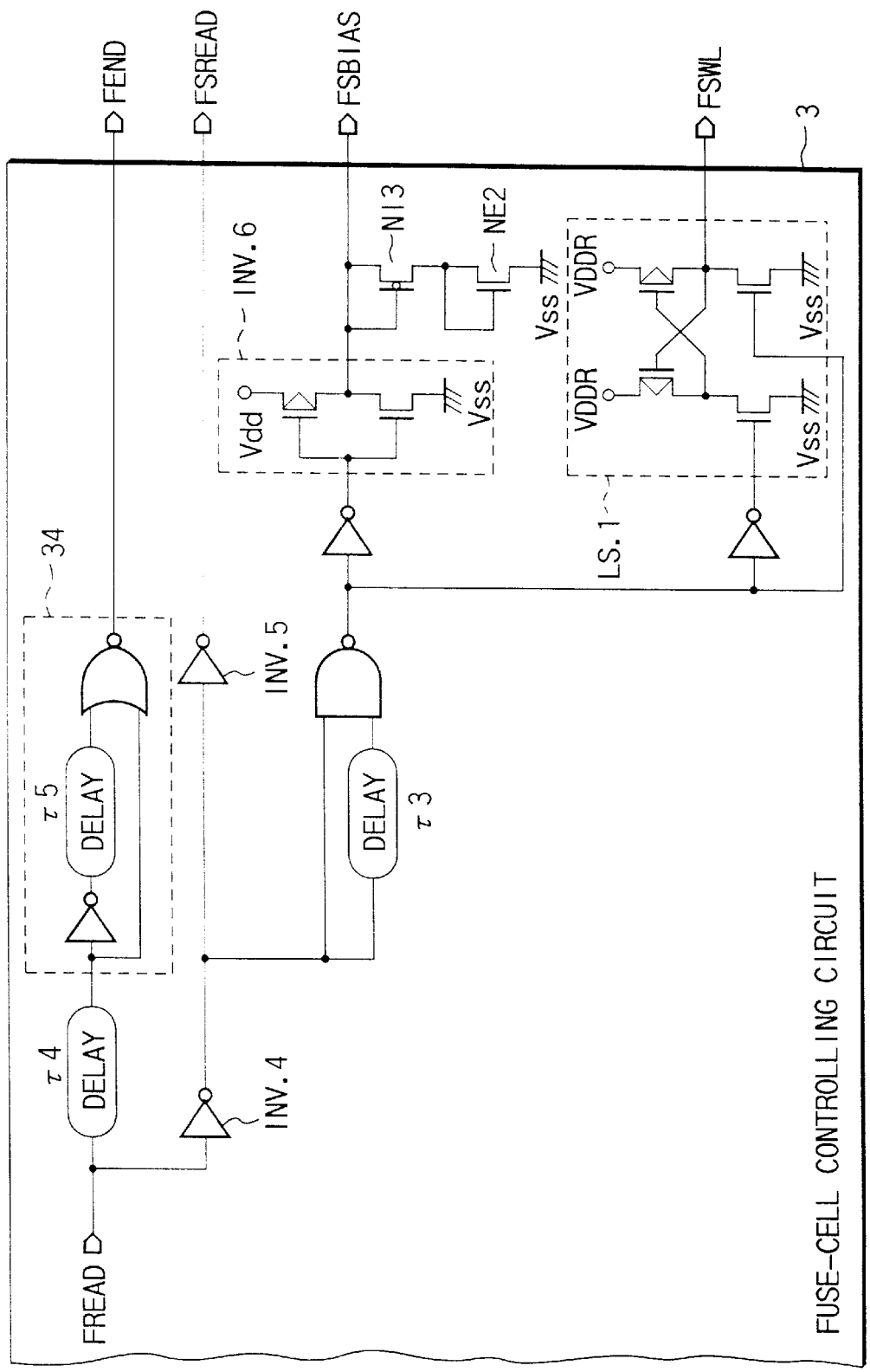
FIG. 7 is a circuit diagram showing an example of the fuse-cell controlling circuit.

FIGS. 6 and 7 are circuit diagrams showing an example of the structure of the fuse-cell controlling circuit 3. As shown in FIG. 6, the fuse-cell controlling circuit 3 incorporates a flip-flop 31. The flip-flop 31 is reset by the signal PONRST' and set by the signal SVDDR. The flip-flop 31 outputs signal SVDDRLAT. When the flip-flop 31 is reset in response to the signal PONRST' and then the signal SVDDR has temporarily been made to be "H" level, the signal SVDDRLAT is maintained at the "H" level. The signal SVDDRLAT is supplied to a pulse signal generating circuit 32.

When the signal SVDDRLAT is made to be "H" level, the pulse signal generating circuit 32 outputs pulse signal TRIGGER having a pulse width of τ1. When the pulse signal TRIGGER is made to be "H" level, an inverter INV.3 shown in FIG. 6 outputs signal FREAD having "H" level. When the level of the signal FREAD is made to be "H" level, an inverter INV.4 shown in FIG. 7 outputs an "L" level signal. Since the inverter INV.4 outputs the "L" level signal, an inverter INV.5 outputs signal FSREAD having "H" level. Moreover, an inverter INV.6 outputs signal FSBIAS having "H" level and level shifter LS.1 outputs signal FSWL having "H" level.

At this time, the level of the signal FREAD is the external power supply Vdd and that of the signal FSWL is the read voltage VDDR. The level of the signal FSBIAS is about the threshold voltage of the NMOS NE2. An NMOS NI3 shown in FIG. 7 is an NMOS having a threshold voltage which is substantially 0V.

The signal FSREAD is supplied to the PMOS P2 of the fuse-cell circuit 4 and the connecting circuit TG. In a period in which the signal FSREAD is "H" level, each of the PMOS P2 and the connecting circuit TG is brought to a conductive state. The signal FSBIAS is supplied to a gate of the NMOS NI1, while the signal FSWL is supplied to the gate of the fuse-cell FC. As a result, the potential of the node 41 is changed according to a fact whether the fuse-cell FC is "ON" or "OFF". The potential of the node 41 is supplied to the input of the connecting circuit TG. The connecting circuit TG outputs "H" level or "L" level according to the potential of the node 41. The latch circuit LAT latches the foregoing output.

Thus, data stored in the fuse-cell FC is read before the usual operation of the apparatus is performed so as to be latched by the latch circuit LAT. The latch circuit LAT outputs latched data FUSE during the usual operation of the apparatus.

When the pulse signal TRIGGER having the "H" level is made to be "L" level and delay time τ2 set to a delay circuit 33 shown in FIG. 6 is elapsed, the signal FREAD is made to be "L" level. When the signal FREAD is made to be "L" level, the signal FSREAD is made to be "L" level. Moreover, each of the signal FSBIAS and the signal FSWL is made to be "L" level after a lapse of delay time τ3. After delay time τ4 is elapsed, the pulse signal generating circuit 34 outputs pulse signal FEND having a pulse width of τ5. After the signal FEND is output, the read/latch sequence is completed.

In the circuit system according to the first embodiment and structured as described above, the reference voltage Vref is generated by a device which has the same structure as that of the fuse-cell FC in place of the band gap reference circuit.

An example of the structure of the reference-voltage generating circuit 5 for generating the reference voltage Vref will now be described.

AS shown in FIG. 3, the reference-voltage generating circuit 5 incorporates a reference voltage outputting stage 51 for outputting the reference voltage Vref, an inputting stage 52 for inputting an input current to the reference voltage outputting stage 51 and a VBIAS generating circuit 53 for outputting bias voltage VBIAS.

The reference voltage outputting stage 51 incorporates PMOS P3 having a source to which the external power supply Vdd is applied; an NMOS NI4 having a drain connected to the drain of the PMOS P3 and a threshold voltage which is substantially 0V and a reference cell REFC having a drain connected to the source of the NMOS NI4 and a source which is applied with the ground potential Vss in the circuit. The reference cell REFC is a nonvolatile memory cell having the same shape and characteristics as those of the fuse-cell FC. That is, the reference cell REFC is a device having the same structure as that of the fuse-cell FC.

The reference voltage Vref can be obtained from n a node 54 between the drain of the PMOS P3 and the drain of the NMOS NI4. The node 54 is connected to the voltage converting circuit 2 and the gate of the reference cell REFC. The gate of the NMOS NI4 is connected to the VBIAS generating circuit 53.

The VBIAS generating circuit 53 incorporates a PMOS P4 having a source which is applied with the external power supply Vdd and a gate which is applied with the ground potential Vss in the circuit, an NMOS NI5 having a drain and a gate connected to the drain of the PMOS P4 and a threshold voltage which is substantially 0V and an NMOS NE6 having a drain and a gate connected to the source of the NMOS NI5 and a source which is applied with the ground potential Vss in the circuit. The VBIAS generating circuit 53 can be operated even when the external power supply Vdd is about 1V.

The bias voltage VBIAS can be obtained from a node 55 between the drain of the PMOS P4 and the drain of the NMOS NI5.

The level of the bias voltage VBIAS is the sum of the threshold voltage of a pentode of the NMOS NI5 and the threshold voltage of the pentode of the NMOS NE6. Assuming that the threshold voltage of the NMOS NI5 is "VTHI" and the threshold voltage of the NMOS NE6 is "VTHE", the bias voltage VBIAS is as follows:

VBIAS=VTHI+VTHE

Since the threshold voltage VTHI of the NMOS NI5 is about 0V, the bias voltage VBIAS is as follows:

VBIAS≈VTHE

Thus, the bias voltage VBIAS is substantially the same as the threshold voltage VTHE of the NMOS NE6. When the threshold voltage VTHE of the NMOS NE6 is made to be about 1V, the bias voltage VBIAS is about 1V. Therefore, gate voltage VGNI4 of the NMOS NI4 is about 1V.

The NMOS NI4 prevents a "soft write phenomenon" of the reference cell REFC when the voltage of the drain of the reference cell REFC is raised. The reference cell REFC is a nonvolatile memory cell having a gate insulating film in which a charge storage portion (a floating gate) for storing charges is formed. Therefore, it is preferable that also the reference cell REFC is structured to prevent change in the threshold voltage which occurs owing to the "soft write phenomenon" similarly to the fuse-cell FC. The reason for this lies in that the structure of the present invention encounters undesirable change in the reference voltage Vref when the threshold voltage of the reference cell REFC is changed.

To prevent the soft write phenomenon, the voltage VD of the drain of the reference cell REFC is made to be 1V or lower. Therefore, the NMOS NI4 is provided such that the voltage VGNI4 of the gate of the NMOS NI4 is made to be about 1V. Since the source of the NMOS NI4 and the drain of the reference cell REFC are connected to each other, the voltage VD of the drain of the reference cell REFC is the voltage of the source of the NMOS NI4. When the threshold voltage of the NMOS NI4 is made to be "VTHI" which is the same as the NMOS NI5, the voltage VD of the drain of the reference cell REFC is as follows:

VD=VGNI4−VTHI

Since the voltage VGNI4 of the gate is the bias voltage VBIAS, the voltage VD of the drain of the reference cell REFC is as follows:

VD=(VTHI+VTHE)−VTHI≈VTHE

Therefore, the voltage VD of the grain is substantially the same as the threshold voltage VTHE of the NMOS NE6. Therefore, the voltage VD of the drain of the reference cell REFC can be made to be 1V or lower. As a result, the "soft write phenomenon" of the reference cell REFC can be prevented.

Each of the NMOS NI1 and NMOS NI5 is a so-called intrinsic type NMOS having a threshold voltage of about 0V. As an alternative to this, an enhancement type NMOS may be employed. When the intrinsic type NMOS is employed, an advantage can be obtained in that dispersion of the voltage VD of the drain of the reference cell REFC can be prevented. Therefore, it is preferable that each of the NMOS NI1 and the NMOS NI5 is the intrinsic type NMOS.

A portion of the reference voltage outputting stage 51 which serves as the load when the reference voltage Vref is generated is constituted by the PMOS P3. To generate the reference voltage Vref, the PMOS P3 must, therefore, be turned on. A circuit for turning the PMOS P3 on is the inputting stage 52.

The inputting stage 52 incorporates a PMOS P5 having a source which is applied with the external power supply Vdd and a constant-current source 56 connected between the drain of the PMOS P5 and the ground potential Vss in the circuit. The constant-current source 56 passes a constant current of 1 $\mu$A. The threshold voltage VTHREFC of the reference cell REFC is defined as the voltage of the gate when the drain current is enlarged to a regulated value. The inputting stage 52 and the reference voltage outputting stage 51 of the reference-voltage generating circuit 5 are formed into the current mirror circuit structures. Therefore, in the first embodiment, the threshold voltage VTHREFC of the reference cell REFC is defined as the voltage of the gate when the drain current is enlarged to 1 $\mu$A.

The voltage VGP3 for turning the PMOS P3 on can be obtained from a node 57 between the drain of the PMOS P5 and the d rain of the constant-current source 56.

When the constant-current source 56 of the reference-voltage generating circuit 5 structured as described above has passed the constant current of 1 $\mu$A, the PMOS P3 is turned o n. Thus, the external power supply Vdd is supplied to the gate of the reference cell REFC through the node 54. When the external power supply Vdd is higher than the threshold voltage VTHREFC of the reference cell REFC, the reference cell REFC is turned on. Assuming that the reference cell REFC comprises the NMOS, the voltage of the node 54, that is, the reference voltage Vref is as follows:

Vref=VTHI+VTHREFC

Since the threshold voltage VTHI of the NMOS 52 is about 0V, the reference voltage Vref is as follows:

Vref≈VTHREFC

As described above, the reference-voltage generating circuit 5 of the semiconductor memory device according to the first embodiment generates the reference voltage Vref by using the threshold voltage VTHREFC of the reference cell REFC.

In the reference-voltage generating circuit 5, the reference voltage Vref is substantially the same as the threshold voltage VTHREFC of the reference cell REFC. The reference cell REFC is a device having the same structure as that of the fuse-cell FC. Therefore, the reference voltage Vref is changed similarly to the threshold voltage VTHFC of the fuse-cell according to change in the power supply voltage and that in the temperature. The reference voltage Vref which is changed as described above is used to convert the boosted voltage VDDP into the read voltage VDDR. Therefore, the read voltage VDDR can be changed to correspond to change in the threshold voltage VTHFC of the fuse-cell FC.

Figure 8A:
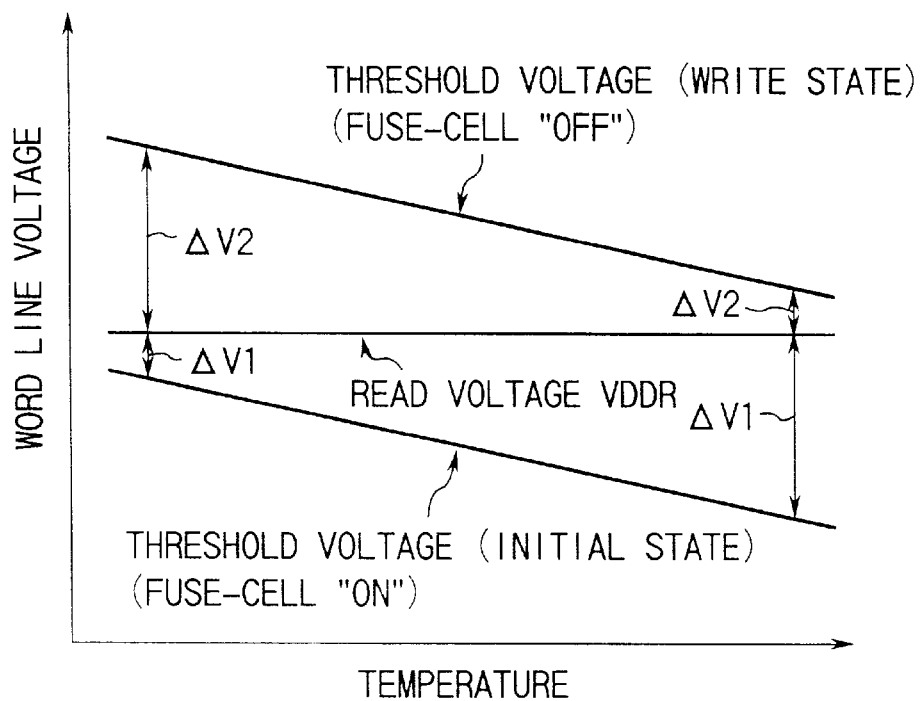
FIG. 8A is a graph showing dependency of read voltage and threshold voltage of the fuse-cell of the conventional structure on the temperature.
Figure 8B:
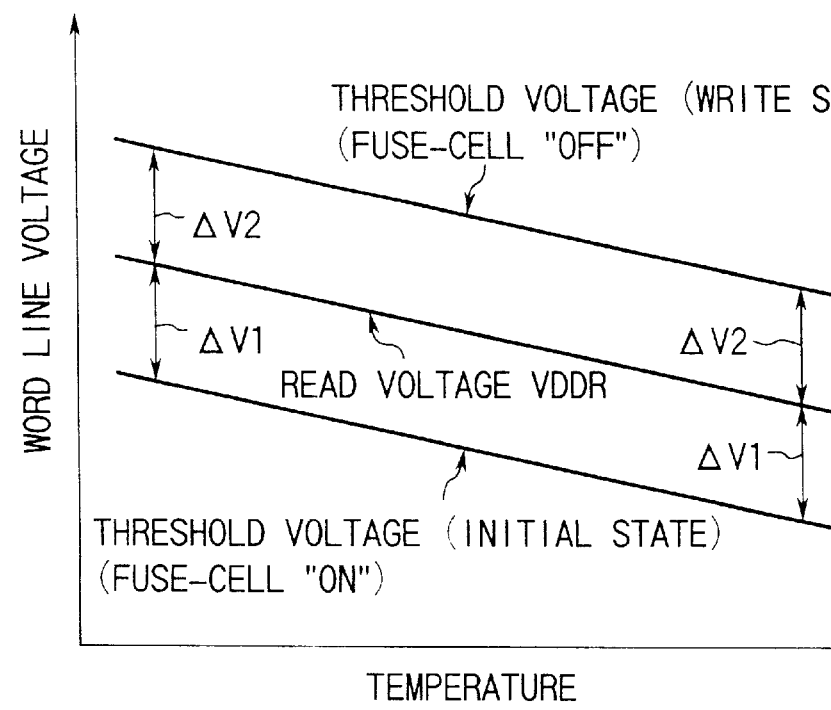
FIG. 8B is a graph showing dependency of read voltage and threshold voltage of the fuse-cell according to the present invention on the temperature.

FIG. 8 is a graph showing dependency of the threshold voltage and the read voltage VDDR of the fuse-cell FC on the temperature. FIG. 8A shows the dependency realized when the reference voltage Vref is generated by using the band gap reference circuit, while FIG. 8B shows the dependency realized when the reference voltage Vref is generated by using the threshold voltage of the reference cell REFC.

As shown in FIG. 8A, when the reference voltage Vref is generated by using the band gap reference circuit, the difference ($\Delta$V1) between the threshold voltage (the threshold voltage (initial state)) and the read voltage VDDR when the fuse-cell FC is turned on in a low temperature region is undesirably reduced. When the fuse-cell FC is turned off in a high temperature region, the difference ($\Delta$V2) between the threshold voltage (the write threshold voltage) and the read voltage VDDR is undesirably reduced.

When the reference voltage Vref is generated by using the threshold voltage of the reference cell REFC, the read voltage VDDR is changed to correspond to change in the threshold voltage of the fuse-cell FC as shown in FIG. 8B. Therefore, the substantially constant difference ($\Delta$V1) between the threshold voltage (the threshold voltage (initial state)) and the read voltage VDDR when the fuse-cell FC is turned on and difference ($\Delta$V2) between the threshold voltage (the write threshold voltage) and the read voltage VDDR when the fuse-cell FC is turned off can be maintained.

The dependency on the power supply voltage is not illustrated. As a matter of course, a tendency similar to that shown in FIG. 8 is realized.

Since the band gap reference circuit is omitted from the reference-voltage generating circuit 5, also the following advantage can be obtained.

The reference-voltage generating circuit 205 shown in FIG. 1 incorporates the differential amplifier (op-amp) OP.200 to feedback-control the level of the reference voltage Vref. Therefore, measures must be taken against the "oscillation phenomenon".

On the other hand, the reference-voltage generating circuit 5 shown in FIG. 3 does not perform the feedback control. Therefore, no measure against the "oscillation phenomenon" is required.

The measures against the "oscillation phenomenon" require a capacitor for preventing the oscillation to be provided for the integrated circuit, causing the area of the circuit to undesirably be enlarged. Since the foregoing capacitor is not required, the area of the reference-voltage generating circuit 5 can be reduced as compared with that of the reference-voltage generating circuit 205.

The differential amplifier OP.200 is an analog circuit which cannot easily be designed, that is, the op-amp.

On the other hand, the reference-voltage generating circuit 5 is a digital circuit. The digital circuit can easily be designed as compared with the analog circuit. Since the analog circuit can be omitted from the integrated circuit on which a multiplicity of circuits are integrated, the load for a designer can be reduced and the development speed can be raised.

Note that the reference-voltage generating circuit 205 is operated before the apparatus performs the usual operation when electric power is supplied. Therefore, the minimum operation voltage Vddmin must satisfy the following conditions:

Vddmin<VPONRST

Vddmin<VBGRMIN

The voltage VPONRST is a minimum level of the external power supply Vdd with which the power supply detection level can be stabilized. The voltage VBGRMIN is a minimum level of the external power supply Vdd with which the output of the band gap reference circuit can be stabilized.

The foregoing conditions for the minimum operation voltage Vddmin must be satisfied including dispersion of temperatures and the processes.

When the minimum operation voltage Vddmin is limited as described above, the design margins permitted for the voltage converting circuit 202, the fuse-cell controlling circuit 203 and the fuse-cell circuit 204 which are connected in the rear of the reference-voltage generating circuit 205 are undesirably reduced. If the design of the circuit is limited or if the margins are reduced, an adverse influence, such as deterioration in the yield, is exerted.

The voltage VBGRMIN and the voltage VPONRST have the following relationship:

VBGRMIN<VPONRST

If the voltage VBGRMIN is higher than the voltage VPONRST, the band gap reference circuit cannot stably generate the reference voltage Vref having a predetermined level.

On the other hand, the reference-voltage generating circuit 5 does not incorporate the band gap reference circuit. Therefore, the conditions for the minimum operation voltage Vddmin do not include the limitation caused from the voltage VBGRMIN. Therefore, the margins in designing the voltage converting circuit 2, the fuse-cell controlling circuit 3 and the fuse-cell circuit 4 which are connected in the rear of the reference-voltage generating circuit 5 can be enlarged.

Therefore, the reference-voltage generating circuit 5 enables a satisfactory degree of freedom in designing the rear circuits to be obtained as compared with the reference-voltage generating circuit 205.

Since the limitations of a necessity of enlarging the margin and making the voltage VBGRMIN to be lower than the voltage VPONRST can be eliminated, the manufacturing yield can be improved.

The first embodiment attains the foregoing advantages.

Although the foregoing reference-voltage generating circuit 5 incorporates the PMOS P3 serving as the load for the reference voltage outputting stage 51, a high resistance of several megaohms may be substituted for the foregoing load. In the foregoing case, the inputting stage 52 is not required.

If the load of the reference voltage outputting stage 51 comprises the high resistance, the reference voltage Vref can be generated when the potential of the external power supply Vdd raised owing to supply of electric power is made to be higher than the threshold voltage VTHREFC of the reference cell REFC. Therefore, resetting of the voltage boosting circuit 1 in response to the signal PONRST' is not required to operate the voltage boosting circuit 1.

[Second Embodiment]

The reference-voltage generating circuit 5 according to the first embodiment generates the reference voltage Vref having the level substantially the same as the threshold voltage VTHREFC of the reference cell REFC. Note that the reference voltage Vref may have a level except for the threshold voltage VTHREFC of the reference cell REFC.

A second embodiment has a structure that the level of the reference voltage Vref is converted.

Figure 9:
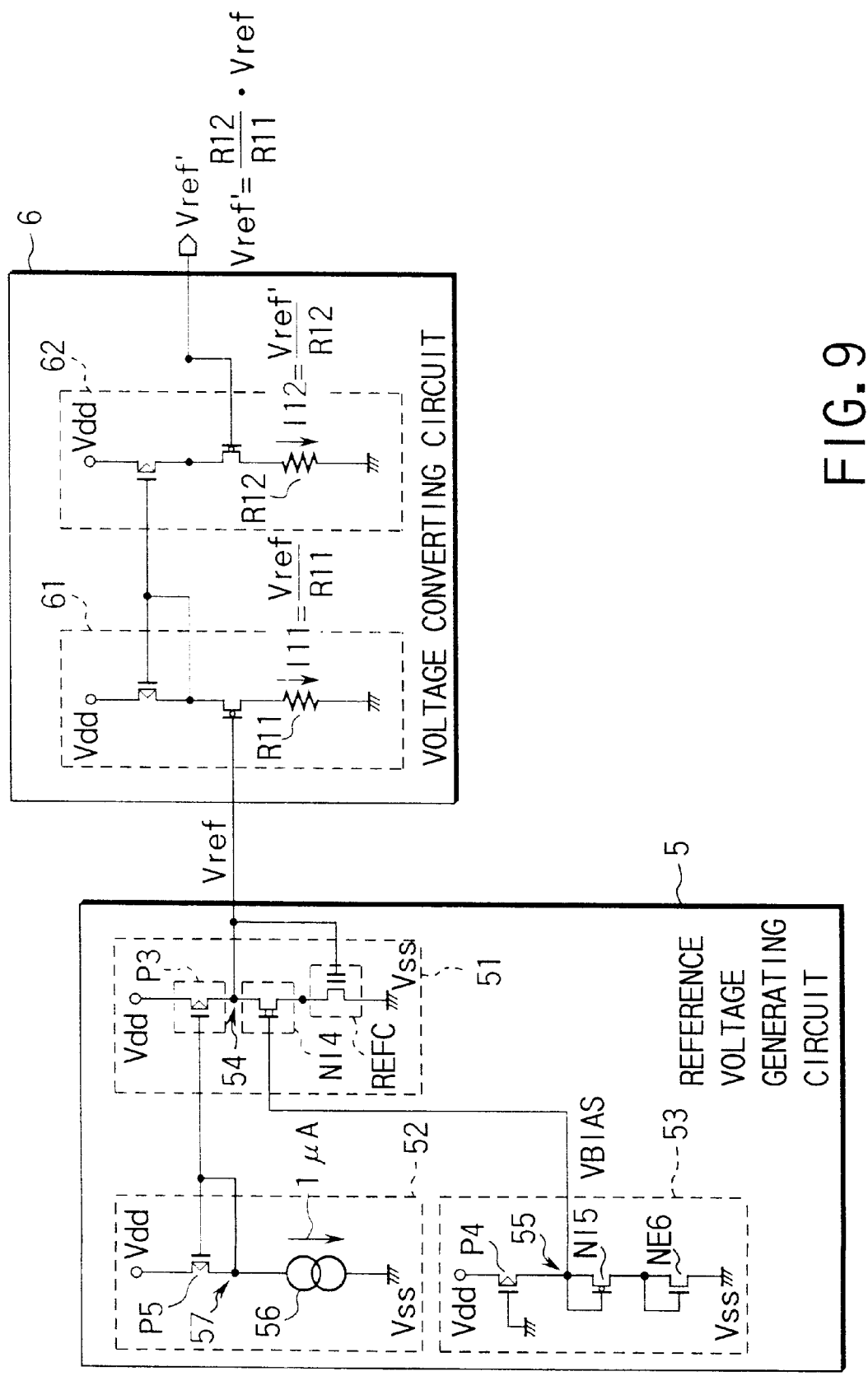
FIG. 9 is a circuit diagram showing a semiconductor memory device according to a second embodiment of the present invention.

FIG. 9 is a circuit diagram showing a semiconductor memory device according to the second embodiment of the present invention. The elements shown in FIG. 9 which are the same as those shown in FIG. 3 are given the same reference numerals.

As shown in FIG. 9, the second embodiment has a structure that a current converting circuit 6 is connected to the position in the rear of the reference-voltage generating circuit 5. The current converting circuit 6 converts the reference voltage Vref into reference voltage Vref'. The reference voltage Vref' is supplied to the voltage converting circuit 2. The current converting circuit 6 is a current mirror circuit incorporating an inputting stage 61, to which the reference voltage Vref is supplied, and an outputting stage 62 for outputting the reference voltage Vref'.

The current converting circuit 6 converts the reference voltage Vref into the reference voltage Vref' having the level to be described later.

Input-stage current I11 which flows in a resistor R11 is as follows:

I11=Vref/R11

Output-stage current I12 which flows in a resistor R12 is as follows:

I12=Vref'/R12

Since the input-stage I11 and the output-stage current I12 are the same in a case of the current mirror circuit, the following relationship is satisfied:

Vref/R11=Vref'/R12

Therefore, the reference voltage Vref' is as follows:

Vref'=(R12/R11)×Vref

Since the reference voltage Vref is substantially the same as the threshold voltage VTHREFC of the reference cell REFC, the reference voltage Vref' is as follows:

Vref'≈(R12/R11)×VTHREFC

As described above, the second embodiment can convert the reference voltage Vref having the level which is substantially the same as the threshold voltage VTHREFC of the reference cell REFC into the reference voltage Vref' having a level which is obtained by multiplying the reference voltage Vref with a resistance ratio of the resistor R11 and the resistor R12. The reference voltage Vref' can be obtained by current-converting the reference voltage Vref. Therefore, the reference voltage Vref' is changed to correspond to the change in the power supply voltage and that in the temperature similarly to the threshold voltage VTHFC of the fuse-cell. Therefore, effects similar to those in the first embodiment can be obtained.

[Third Embodiment]

The foregoing embodiment is structured such that the reference-voltage generating circuit 5 generates the reference voltage Vref having the level which is substantially the same as the level of the threshold voltage VTHREFC of the reference cell REFC. The threshold voltage VTHREFC is a voltage on an assumption of the initial threshold voltage. That is, the threshold voltage VTHREFC is a threshold voltage realized in a state in which the reference cell REFC is irradiated with ultraviolet rays to discharge electrons from the floating gate of the reference cell REFC. Therefore, the reference voltage Vref is the initial threshold voltage VTHREFCint of the reference cell REFC.

To change the reference voltage Vref into a level except for the level of the initial threshold voltage VTHREFCint, the reference voltage Vref must be current-converted by the current converting circuit 6 as described in the second embodiment.

To change the level of the reference voltage Vref into a level except for the level of the initial threshold voltage VTHREFCint, electrons may be injected into the floating gate of the reference cell REFC, that is, data may be written on the reference cell REFC.

The third embodiment structured as described above enables the reference voltage Vref to be changed into a level except for the initial threshold voltage VTHREFCint if the current converting circuit 6 is omitted from the structure.

When the quantity of electrons which must be injected into the floating gate is controlled, the threshold voltage VTHREFC can be changed in an analog manner. Thus, a relatively wide degree of freedom can be obtained when the level of the reference voltage Vref is set.

To write data on the reference cell REFC to set the level of the reference voltage Vref, a structure must be formed such that a data writing circuit (not shown) is connected to the reference-voltage generating circuit 5.

A data erasing circuit may be connected to the reference-voltage generating circuit 5. Since data can be erased from the reference cell REFC in the foregoing case, setting of the reference voltage Vref can be tried again.

Since the structure which permits setting of the reference voltage Vref to again be tried is employed, an advantage can be obtained in that an optimum level of the reference voltage Vref is tested and monitored in a state of a chip.

The structure according to the third embodiment may be combined with the structure according to the second embodiment.

[Fourth Embodiment]

In the first embodiment, the signal FSBIAS is generated by the fuse-cell controlling circuit 3. The NMOS NI1 having a gate which is supplied with the signal FSBIAS prevents the "soft write phenomenon" of the fuse-cell FC. That is, the NMOS NI1 has a function similar to that of the NMOS NI4. Therefore, as an alternative to the signal FSBIAS, the bias voltage VBIAS may be supplied to the gate of the NMOS NI1.

Figure 10:
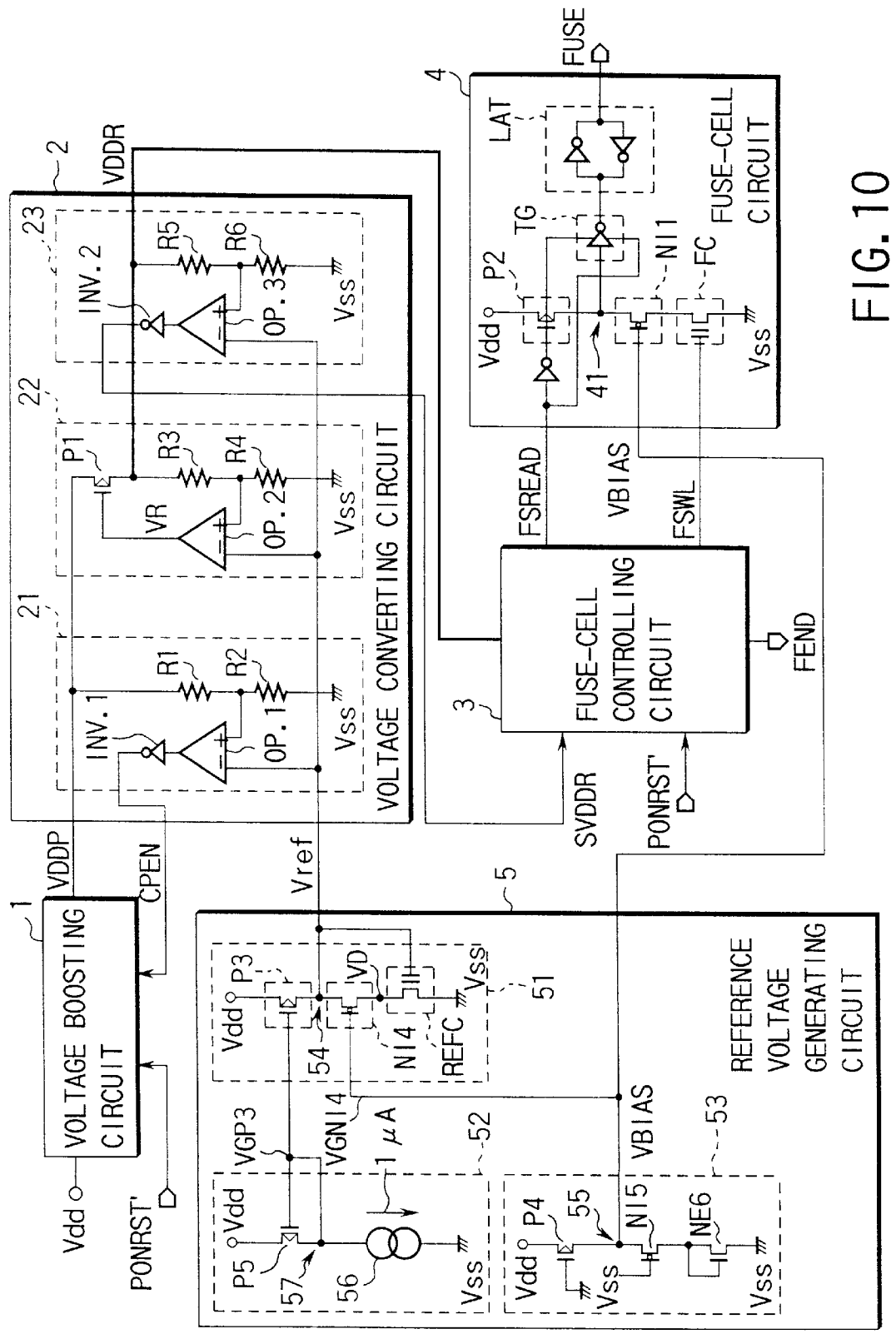
FIG. 10 is a circuit diagram showing a semiconductor memory device according to a fourth embodiment of the present invention.

FIG. 10 is a circuit diagram showing a semiconductor memory device according to a fourth embodiment of the present invention. Referring to FIG. 10, the same elements as those shown in FIG. 3 are given the same reference numerals.

As shown in FIG. 10, the fourth embodiment is structured such that the voltage VBIAS generated by the VBIAS generating circuit 53 is supplied to the gate of the NMOS NI4 and also the gate of the NMOS NI1.

Since the fourth embodiment is structured as described above, the bias voltage VBIAS is supplied to each of the gates of the NMOS NI4 and the NMOS NI1, the voltages of the gates of the NMOS NI4 and the NMOS NI1 can be made to be the same. As a result, the voltage of the drain of the reference cell REFC and that of the drain of the fuse-cell FC can accurately be made to be the same.

Therefore, the conditions of the voltage which must be supplied to the reference cell REFC can considerably be made to be the same as the conditions of the voltage which must be applied to the fuse-cell FC. Hence it follows that change in the level of the reference voltage Vref corresponding to the change in the power supply voltage and that in the temperature can considerably be made to be the same as the change in the threshold voltage VTHFC of the fuse-cell.

According to the fourth embodiment, the circuit system for generating the signal FSBIAS can be omitted from the fuse-cell controlling circuit 3. Therefore, another advantage can be obtained in that the size of the circuit can be reduced.

[Fifth Embodiment]

As described in the first embodiment, when the analog circuit is omitted from the integrated circuit on which a multiplicity of circuits are integrated, the load for a designer can be reduced and the development speed can be raised.

The voltage converting circuit 2 according to the first embodiment incorporates a VDDR regulator 22. The VDDR regulator 22 causes the differential amplifier OP.2 to regulate the boosted voltage VDDP to the read voltage VDDR. The differential amplifier OP.2 is an analog circuit.

The fifth embodiment is structured to provide a VDDR regulator 12 which does not incorporate the differential amplifier OP.2.

Figure 11:
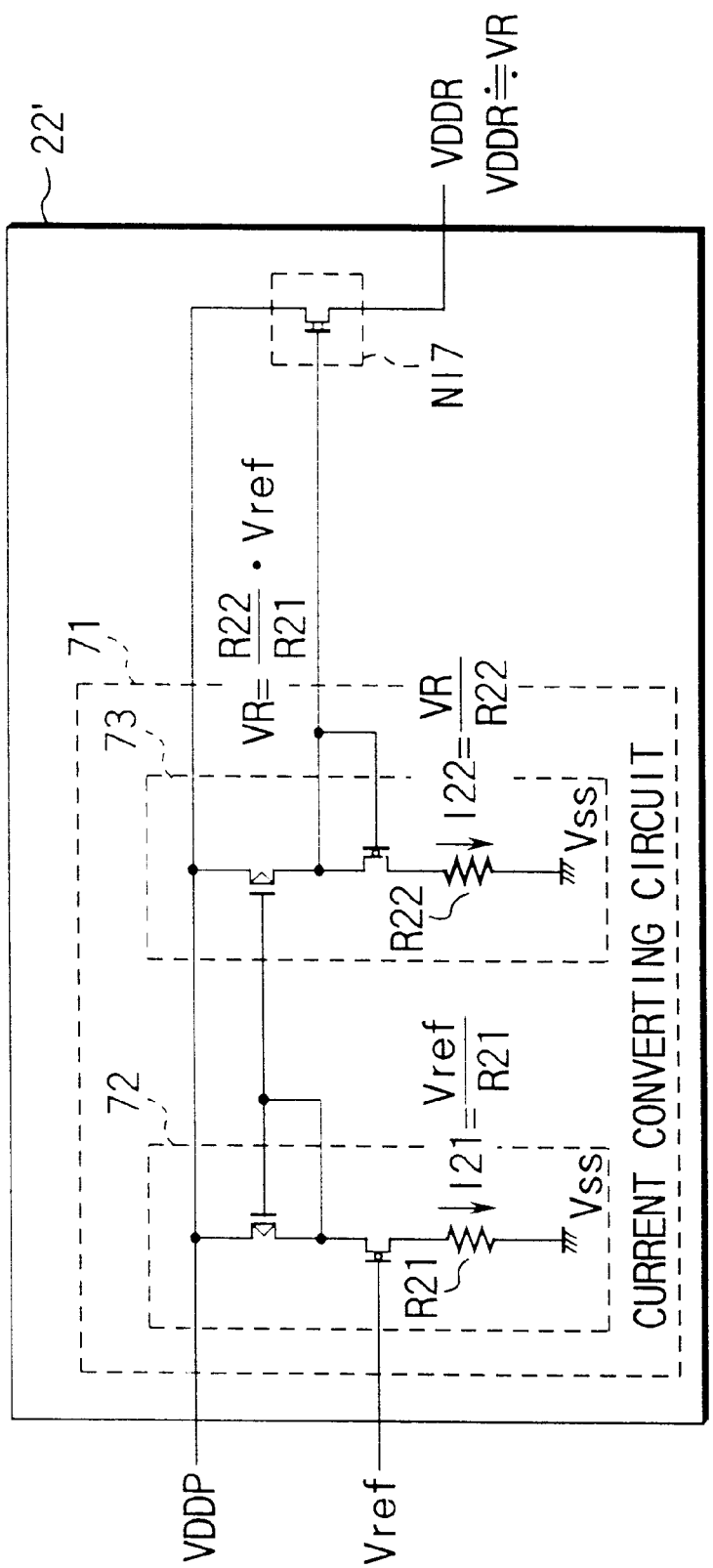
FIG. 11 is a circuit diagram showing a semiconductor memory device according to a fifth embodiment of the present invention.

FIG. 11 is a circuit diagram showing an example of the structure of a regulator according to the fifth embodiment.

As shown in FIG. 11, a regulator 22' according to the fifth embodiment incorporates a current converting circuit 71 and a NMOS NI7 having a drain which is applied with the boosted voltage VDDP and a source from which the read voltage VDDR is output. The threshold voltage of the NMOS NI7 is made to be substantially 0V. The NMOS NI7 constitutes a source-follower-type step-down circuit.

When the threshold voltage of the NMOS NI7 is made to be "VTHI", the voltage of the source of the NMOS NI7, that is, the read voltage VDDR is as follows:

VDDR=VR−VTHI

Since the threshold voltage VTHI of the NMOS NI7 is substantially 0V, the read voltage VDDR is as follows:

VDDR≈VR

As described above, the NMOS NI7 substantially regulates the boosted voltage VDDP to the voltage of the gate, that is, the regulated voltage VR.

The current converting circuit 71 current-converts the reference voltage Vref to the regulated voltage VR. The regulated voltage VR is supplied to the gate of the NMOS NI7. The current converting circuit 71 is a current mirror circuit incorporating an inputting stage 72 which is applied with the reference voltage Vref and an outputting stage 73 which outputs the regulated voltage VR.

The current converting circuit 71 converts the reference voltage Vref into the regulated voltage VR having the following level:

Input-stage current I21 which flows in a resistor R21 is as follows:

I21=Vref/R21

Output-stage current I22 which flows in a resistor R22 is as follows:

I22=VR/R22

Since the input-stage I21 and the output-stage current I22 are the same in a case of the current mirror circuit, the following relationship is satisfied:

Vref/R21=VR/R22

Therefore, the regulated voltage VR is as follows:

VR=(R22/R21)×Vref

Assuming that the reference voltage Vref is substantially the same as the threshold voltage VTHREFC of the reference cell REFC, the regulated voltage VR is as follows:

VR≈(R22/R21)×VTHREFC

As described above, according to the fifth embodiment, the reference voltage Vref is converted into the regulated voltage VR having the level obtained by multiplying the reference voltage Vref with a resistance ratio of the resistor R21 and the resistor R22. The regulated voltage VR can be obtained by current-converting the reference voltage Vref. Therefore, the regulated voltage VR is changed when the power supply voltage is changed or when the temperature is changed similarly to the threshold voltage VTHFC of the fuse-cell.

The regulated voltage VR which is changed as described above is supplied to the source-follower-type step-down circuit, that is, the gate of the NMOS NI7. The NMOS NI7 regulates the boosted voltage VDDP to the read voltage VDDR. In the source-follower-type step-down circuit, the voltage of its source is changed to correspond to the voltage of the gate. Therefore, the read voltage VDDR is changed to correspond to the change in the regulated voltage VR.

Therefore, the read voltage VDDR can be changed to correspond to the change in the threshold voltage VTHFC of the fuse-cell corresponding to the change in the power supply voltage and the change in the temperature.

Moreover, the fifth embodiment can constitute the foregoing regulator 22' without using an analog circuit, that is, the differential amplifier and feedback control.

Therefore, the area of the regulator 22' can be reduced as compared with the area of the regulator 22. Since the analog circuit can be omitted from the integrated circuit on which a multiplicity of circuits are integrated, the load for a designer can be reduced and the development speed can be raised.

Figure 12:
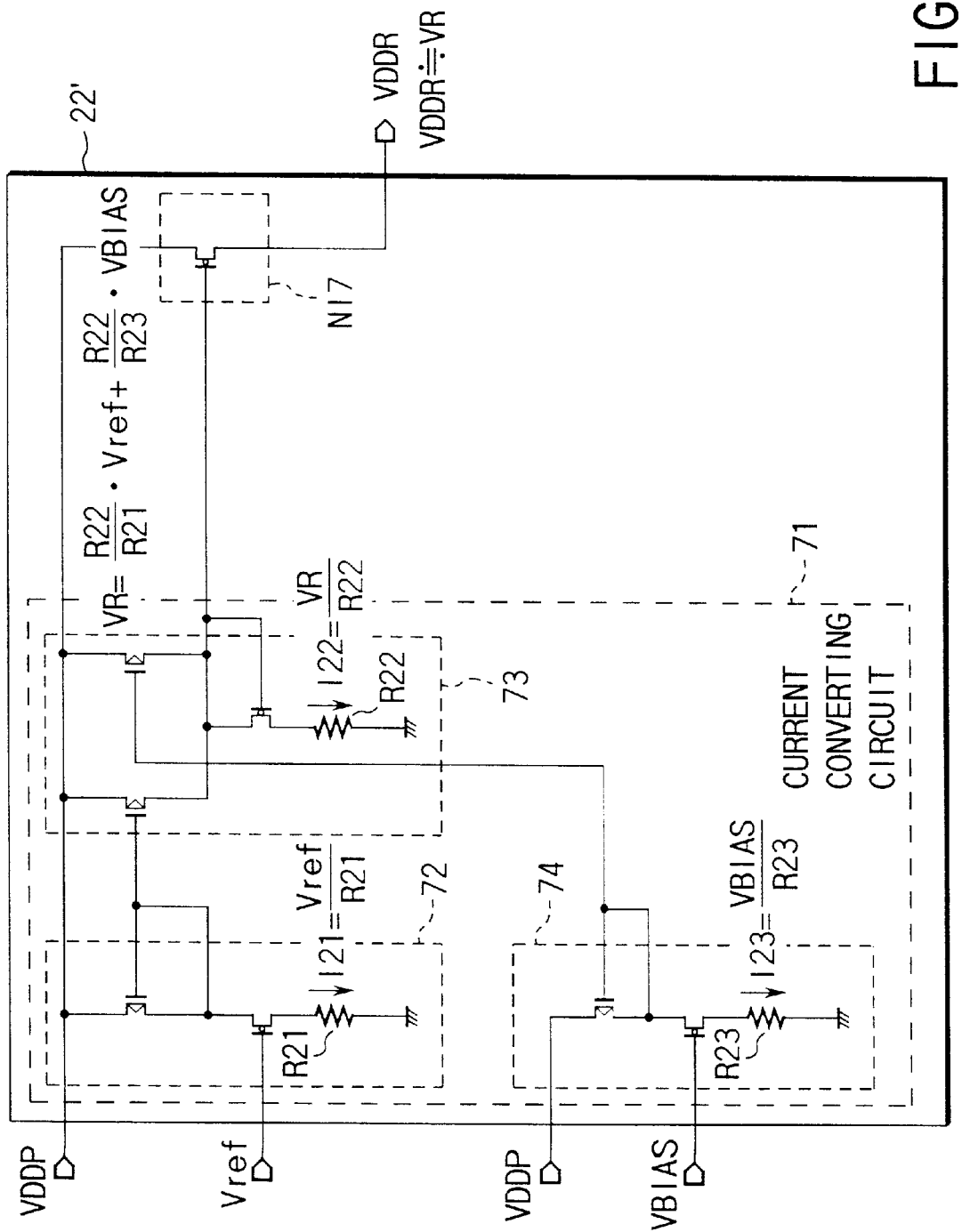
FIG. 12 is another circuit diagram showing a semiconductor memory device according to the fifth embodiment of the present invention.

FIG. 12 is a circuit diagram showing another example of the regulator according to the fifth embodiment. Referring to FIG. 12, the same elements as those shown in FIG. 11 are given the same reference numerals.

The other example of the circuit is employed when the multiplication with the resistance ratio of the resistor R21 and the resistor R22 of the current converting circuit 71 is insufficient to perform the conversion to a required regulated voltage VR.

As shown in FIG. 12, the other example of the circuit is structured such that an inputting stage 74 is added to the current converting circuit 71. The bias voltage VBIAS is supplied to the inputting stage 74.

The other example of the circuit is structured to convert the reference voltage Vref into the regulated voltage VR having the following level:

First input-stage current I21 which flows in the resistor R21 is as follows:

I21=Vref/R21

Second input-stage current I23 which flows in the resistor R23 is as follows:

I23=VBIAS/R23

Output-stage current I22 which flows in the resistor R22 is as follows:

I22=VR/R22

Since the sum of the input-stage currents and the output-stage current is the same in a case of a current mirror circuit having a plurality of current mirror inputting stages, the following relationship is satisfied:

Vref/R21+VBIAS/R23=VR/R22

Therefore, the regulated voltage VR is as follows:

VR=(R22/R21)×Vref+(R22/R23)×VBIAS

Assuming that the reference voltage Vref is substantially the same as the threshold voltage VTHREFC of the reference cell REFC, the regulated voltage VR is as follows:

VR≈(R22/R21)×VTHREFC+(R22/R23)×VBIAS

As described above, according to the other example of the circuit, the voltage (R22/R23)×VBIAS is added to the regulated voltage VR as compared with the foregoing example of the circuit. Therefore, if the types of resistors in the integrated circuit are limited, a satisfactory degree of freedom can be permitted when the regulated voltage VR is set.

The voltage which is applied to the current mirror inputting stage 74 may be changed to voltage (not shown) except for the bias voltage VBIAS. The other voltage is exemplified by a voltage generated by a band gap reference circuit.

The present invention does not negate the band gap reference circuit. The present invention is structured to overcome a fact that when the reference voltage Vref for use in converting the read voltage VDDR is generated by using the band gap reference circuit, the level of the read voltage VDDR is undesirably made to be constant regardless of the change in the power supply voltage and that in the temperature.

A multiplicity of the semiconductor memory devices require the band gap reference circuit which can generate voltage having a substantially constant level regardless of the change in the power supply voltage and that in the temperature. That is, the semiconductor memory device to which the present invention is applied is usually provided with the band gap reference circuit.

A modification (not shown) may be employed in which the reference voltage Vref described in the second embodiment is supplied to the inputting stage 72 of the current converting circuit 71 to make the set value of the regulated voltage VR to a level except for the voltage (R22/R21)× VTHREFC.

As a matter of course, the foregoing modification may be combined with the other example of the circuit.

[Sixth Embodiment]

The semiconductor memory device according to the first embodiment incorporates the VDDP detector 21, the VDDR regulator 22 and the VDDR detector 23. Each of the foregoing circuits include the differential amplifier (an op-amp.).

According to the sixth embodiment, a circuit is provided which is capable of outputting the read voltage VDDR without use of the differential amplifier.

Figure 13:
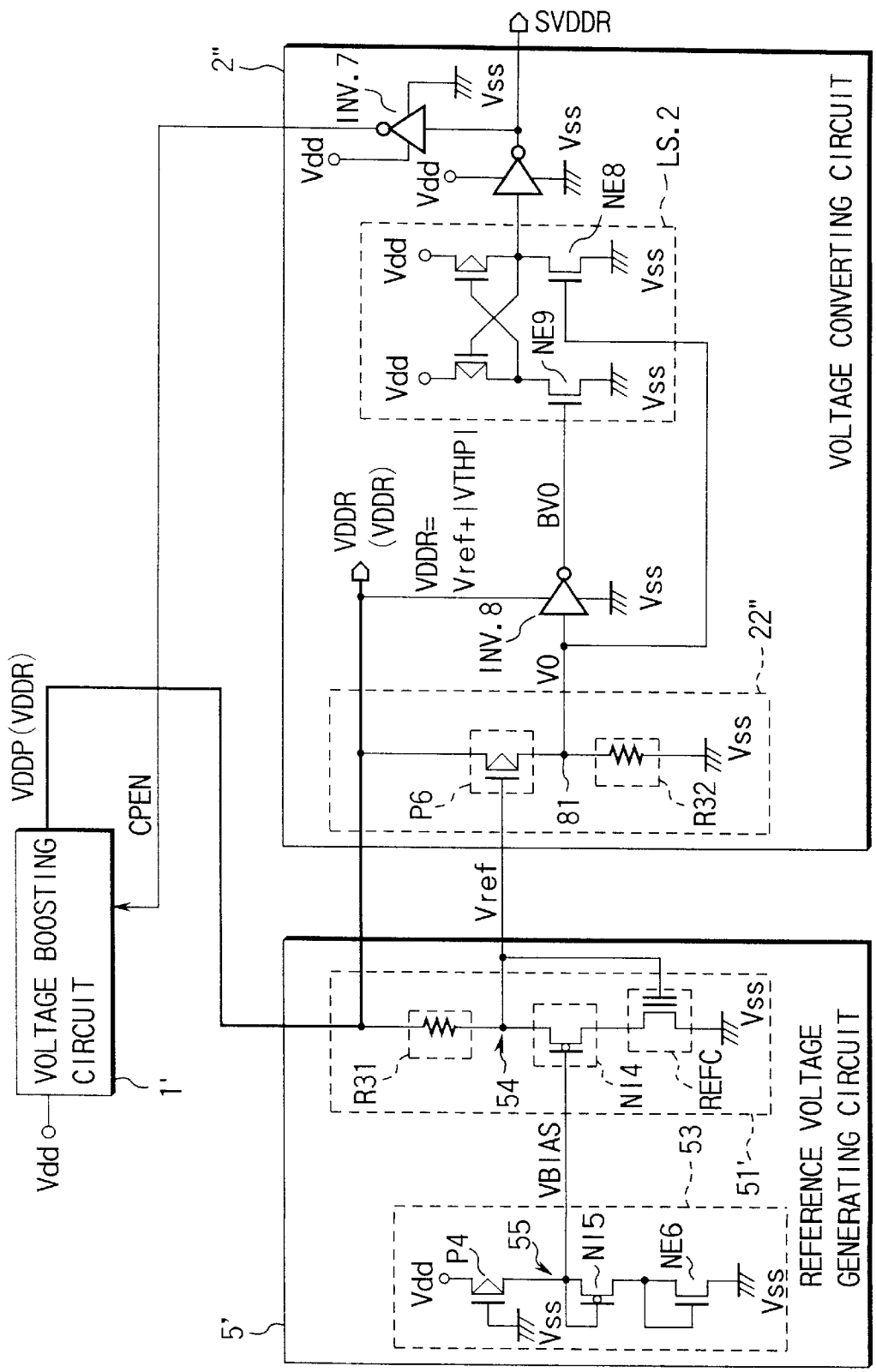
FIG. 13 is a circuit diagram showing a semiconductor memory device according to a sixth embodiment of the present invention.
Figure 14:
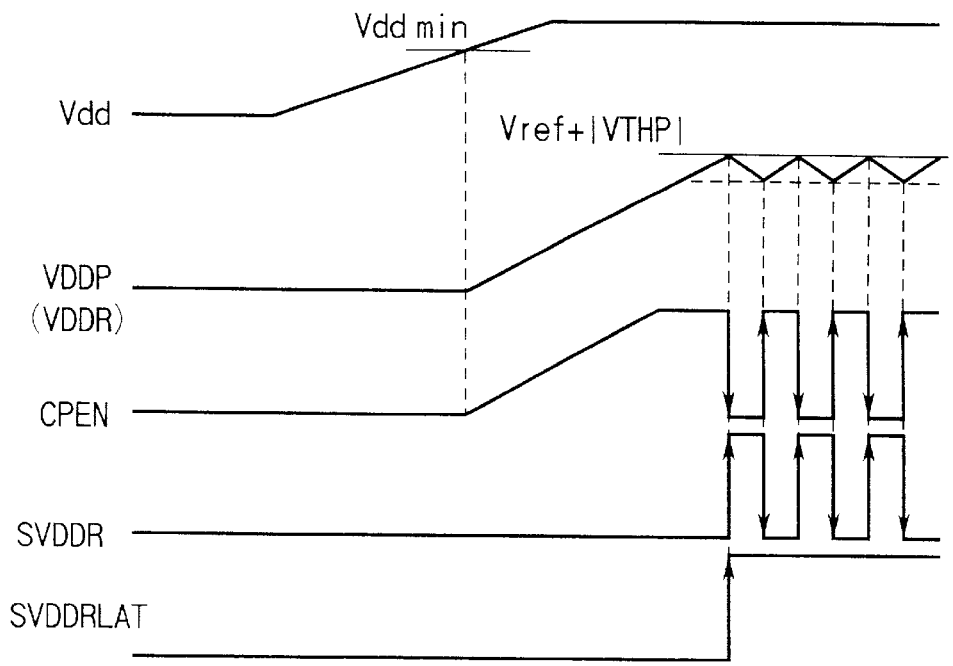
FIG. 14 is a graph showing waveforms of signals to described the operation of the semiconductor memory device according to the sixth embodiment of the present invention.

FIG. 13 is a circuit diagram showing an example of a voltage converting circuit according to the sixth embodiment of the present invention. FIG. 14 is a graph showing main signals or voltage waveforms.

In the foregoing embodiment, when the signal PONRST' is made to be the "L" level, the voltage boosting circuit 1 outputs the boosted voltage VDDP. In the fifth embodiment, the operation is performed if the signal PONRST' does not exist. The structure and operation of this embodiment will now be described.

Figure 15:
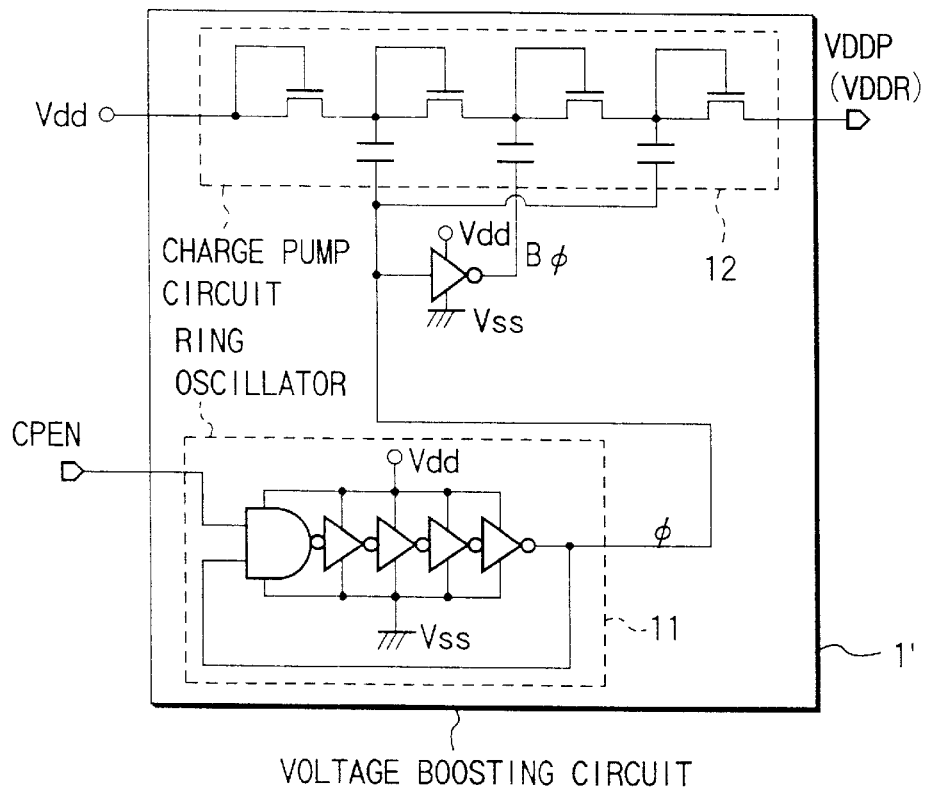
FIG. 15 is a circuit diagram showing an example of the voltage boosting circuit.

As shown in FIG. 14, when the potential of the external power supply Vdd is raised from 0V to the minimum operation voltage Vddmin, rise in the output of the inverter INV.7 of the voltage converting circuit 2' shown in FIG. 13 is started. Thus, the voltage boosting circuit 1' starts the operation for raising the external power supply Vdd to output the boosted voltage VDDP. An example of the voltage boosting circuit 1' is shown in FIG. 15. The boosted voltage VDDP is supplied to the reference-voltage generating circuit 5'. In the fifth embodiment, the boosted voltage VDDP is the read voltage VDDR.

As shown in FIG. 13, the reference voltage outputting stage 51' of the reference-voltage generating circuit 5' employs the resistor R31 as the load for generating the reference voltage Vref in place of the PMOS P3. The resistor R31 has a high resistance of several megaohms. The reference-voltage generating circuit 5' having the above-mentioned structure does not require the inputting stage 52 shown in FIG. 3 to generate the reference voltage Vref.

Figure 16A:
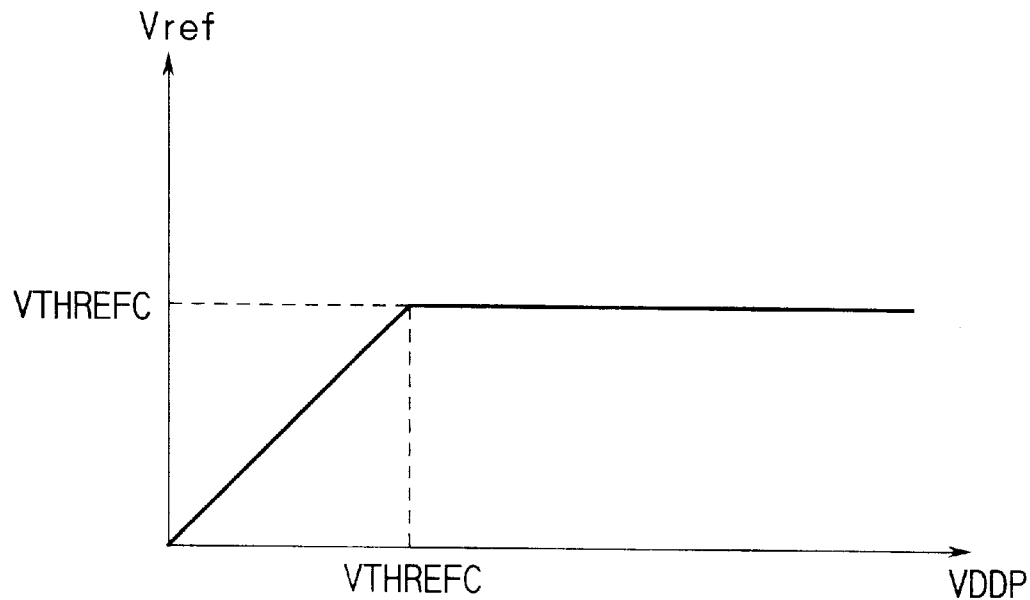
FIG. 16A is a graph showing the relationship between reference voltage Vref and boosted voltage VDDP.

When the level of the boosted voltage VDDP is raised to a level higher than the threshold voltage VTHREFC of the reference cell REFC, the reference cell REFC is turned on. When the reference cell REFC is turned on, the reference voltage Vref is stabilized about the threshold voltage VTHREFC of the reference cell REFC. The relationship between the boosted voltage VDDP and the reference voltage Vref is shown in FIG. 16A. The reference voltage Vref is supplied to the VDDR regulator 22" of the voltage converting circuit 2".

The VDDR regulator 22" has both of the function of regulating the boosted voltage VDDP to the read voltage VDDR having a predetermined level and the function to serve as a detector for detecting a fact that the read voltage VDDR is raised to the predetermined level.

The VDDR regulator 22" incorporates the PMOS P6 having a source which is supplied with the boosted voltage VDDP and the resistor R32, in series, connected between the drain of the PMOS P6 and the ground potential Vss in the circuit. The resistor R32 has a high resistance value of several megaohms.

Detection voltage VO for detecting whether or not the boosted voltage VDDP is raised to a predetermined level of the read voltage VDDR can be obtained from a node 81 between the drain of the PMOS P6 and the resistor R32.

Figure 16B:
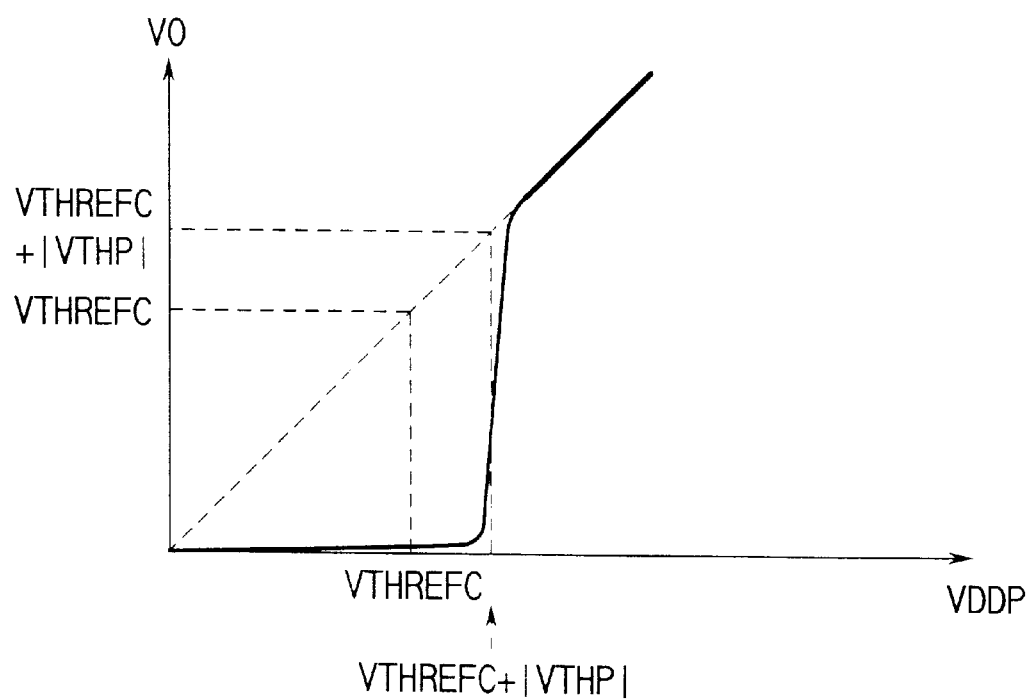
FIG. 16B is a graph showing the relationship between the voltage VO and boosted voltage VDDP.

When the level of the boosted voltage VDDP is raised to a level higher than the threshold voltage VTHREFC of the reference cell REFC and higher than the absolute value of the threshold voltage VTHP of the PMOS P6, the detection voltage VO is raised to correspond to the rise in the boosted voltage VDDP. That is, the level of the detection voltage VO is "L" level during a period in which the PMOS P6 is "OFF". When the PMOS P6 is turned on, the level is made to be "H" level. The relationship between the boosted voltage VDDP and the detection voltage VO is shown in FIG. 16B. The detection voltage VO is supplied to the inverter INV.8 and the level shifter LS.2.

In a period in which the level of the detection voltage VO is lower (when the PMOS P6 is turned off) than the threshold voltage of each of the inverter INV.8 and the level shifter LS.2, the NMOS NE8 of the level shifter LS.2 is turned off and the NMOS NE9 is turned on. Thus, the voltage converting circuit 2" outputs signal SVDDR having "L" level and signal CPEN having "H" level. In a period in which the signal CPEN is "H" level, the voltage boosting circuit 1' performs the operation for boosting the external power supply Vdd.

When the PMOS P6 is turned on and the level of the detection voltage VO is raised to a level higher than the inverter INV.8 and the level shifter LS.2, the NMOS NE8 of the level shifter LS.2 is turned on and the NMOS NE9 is turned off. As a result, the voltage converting circuit 2" outputs the SVDDR having the "H" level and the signal CPEN having the "L" level. In a period in which the signal CPEN is "L" level, the voltage boosting circuit 1' interrupts the operation for boosting the external power supply Vdd. Thus, the signal SVDDR is made to be "H" level. Thus, a fact that the boosted voltage VDDP is raised to the predetermined read voltage VDDR can be detected.

The level of the read voltage VDDR will now be described.

Assuming that the threshold voltage of the PMOS P6 of the VDDR regulator 22" is "VTHP", the PMOS P6 is turned on when the boosted voltage VDDP is raised to the following level:

VDDP=Vref+|VTHP|

That is, the boosted voltage VDDP is regulated to the voltage "Vref+|VTHP|" when the PMOS P6 is turned on. The foregoing voltage "Vref+|VTHP|" is the read voltage VDDR.

Assuming that the reference voltage Vref is substantially the same as the threshold voltage VTHREFC of the reference cell REFC, the boosted voltage VDDP is as follows:

VDDP≈VTHREFC+|VTHP|

As described above, the sixth embodiment can regulate the boosted voltage VDDP to the level obtained by adding the absolute value of the threshold voltage VTHP of the PMOS P6 to the threshold voltage VTHREFC of the reference cell REFC. The regulated voltage is the read voltage VDDR. The voltage "VTHREFC+|VTHP|" is about 3.7V.

Since the threshold voltage VTHREFC of the reference cell REFC is changed owing to change in the power supply voltage and that in the temperature, the foregoing read voltage VDDR is changed to correspond to the change in the threshold voltage of the fuse-cell FC. As a result, an effect obtainable from the foregoing embodiment can be obtained.

Moreover, according to the sixth embodiment, the differential amplifier OP.2 and the feedback control are not required to regulate the boosted voltage VDDP to the read voltage VDDR. Therefore, design of the circuit can easily be performed and any measure against the "oscillation phenomenon" is not required. Moreover, the yield can be improved. According to the sixth embodiment, also the VDDR detector 23 incorporating the differential amplifier OP.3 is not required. Therefore, the number of circuits can be reduced and the foregoing effect can furthermore satisfactorily be obtained.

The reference-voltage generating circuit 5' described in the sixth embodiment has the outputting stage 51' which uses the boosted voltage VDDP as the power supply. The foregoing structure attains the following advantages.

When the external power supply Vdd is not higher than 3V, also the reference cell REFC constituted by the nonvolatile memory which is the same as the fuse-cell FC sometimes encounters a fact that the initial threshold voltage is higher than the external power supply Vdd. The voltage of the gate of the reference cell REFC is obtained from the node 54 from which the reference voltage Vref is obtained. Therefore, if the threshold voltage of the reference cell REFC is higher than the external power supply Vdd, the reference cell REFC is undesirably turned off. That is, the reference voltage Vref cannot be generated.

Therefore, the sixth embodiment is structured such that the power supply for the outputting stage 51' is the boosted voltage VDDP obtained by boosting the external power supply Vdd. Thus, if the external power supply Vdd is lower than the threshold voltage of the reference cell REFC, the reference cell REFC can be turned on.

According to the sixth embodiment, the above-mentioned advantage can furthermore be obtained.

In the sixth embodiment, the read voltage VDDR is "Vref+|VTHP|". To change the level of the read voltage VDDR, at least either of the following methods is employed:

(A) The level of the reference voltage Vref is changed.
(B) The threshold voltage VTHP of the PMOS P6 is changed.

The foregoing method (A) is realized by changing the threshold voltage VTHREFC of the reference cell REFC. As described in the third embodiment, the reference cell REFC is the nonvolatile memory. Therefore, when electrons are injected into the floating gate (that is, data is written), the threshold voltage VTHREFC of the reference cell REFC can be changed.

When the resistance of each of the resistors R31 and R32 is changed, the reference voltage Vref can be changed.

The resistance of each of the resistors R31 and R32 exerts an influence on the relationship between the power supply voltage (the boosted voltage VDDP in the sixth embodiment) of the reference voltage outputting stage 51' and the drain current of the reference cell REFC. The threshold voltage VTHREFC of the reference cell REFC is defined as the voltage of the gate when the drain current is enlarged to a regulated value which is usually 1 μA). That is, when the level of the reference voltage outputting stage 51' realized when the drain current of the reference cell REFC is enlarged to the regulated value is changed, the voltage of the gate realized when the drain current is enlarged to the regulated value can be changed. The foregoing fact is equivalent to change in the threshold voltage VTHREFC of the reference cell REFC.

The foregoing method (B) can be realized by changing the thickness of the oxide gate film of the PMOS P6, by changing whether or not channel ions are implanted or by changing the length of the gate.

A plurality of types of the PMOS having the threshold voltage VTHP changed by any one of the foregoing method may be provided for the chip. The above-mentioned structure enables the threshold voltage VTHP of the PMOS P6 to be changed by changing the mask for wiring and by selecting a PMOS having an arbitrary threshold voltage. That is, when the mask for wiring is changed, the threshold voltage VTHP of the PMOS P6 can be changed without a necessity of changing the manufacturing process.

The foregoing method can be adapted to the resistors R31 and R32. That is, plural types of resistors having different resistance values are provided for the chip. Then, the mask for wiring is changed, followed by selecting resistors having arbitrary resistance values. Thus, the resistance values of the resistors R31 and R32 can be changed.

The foregoing method with which plural types of the PMOS having different threshold voltages and resistors having different resistance values are provided for the chip enables the level of the read voltage VDDR to be changed by only changing the mask for wiring without a necessity of changing the manufacturing process. Therefore, the turn-around-time from order intake of products to completion of the manufacturing process can be shortened.

The foregoing method may be applied to a structure in which data is written on the reference cell REFC to change the threshold voltage VTHREFC. In this case, a writing circuit and an erasing circuit are required to be provided for the reference-voltage generating circuit 5'. Therefore, the level of the read voltage VDDR can be changed without a necessity of changing the manufacturing process. Therefore, the turn-around-time from order intake of products to completion of the manufacturing process can be shortened.

[Seventh Embodiment]

The foregoing embodiment is structured on the assumption that the voltage boosting circuit 1 or 1' is operated even after the data read/latch sequence is completed.

However, the voltage boosting circuit 1 or 1' may be deactivated after the data read/latch sequence is completed.

To deactivate the voltage boosting circuit 1 or 1' after the data read/latch sequence is completed, a method (not shown) is employed with which the signal FEND is used to deactivate the ring oscillator 11 of the voltage boosting circuit 1 or 1'.

According to the foregoing seventh embodiment, the voltage boosting circuit 1 or 1' is deactivated after the data read/latch sequence is completed. Therefore, an advantage can be obtained in that power consumption can be reduced.

[Eighth Embodiment]

An eighth embodiment concerns an example of a semiconductor memory device according to the present invention.

Figure 17:
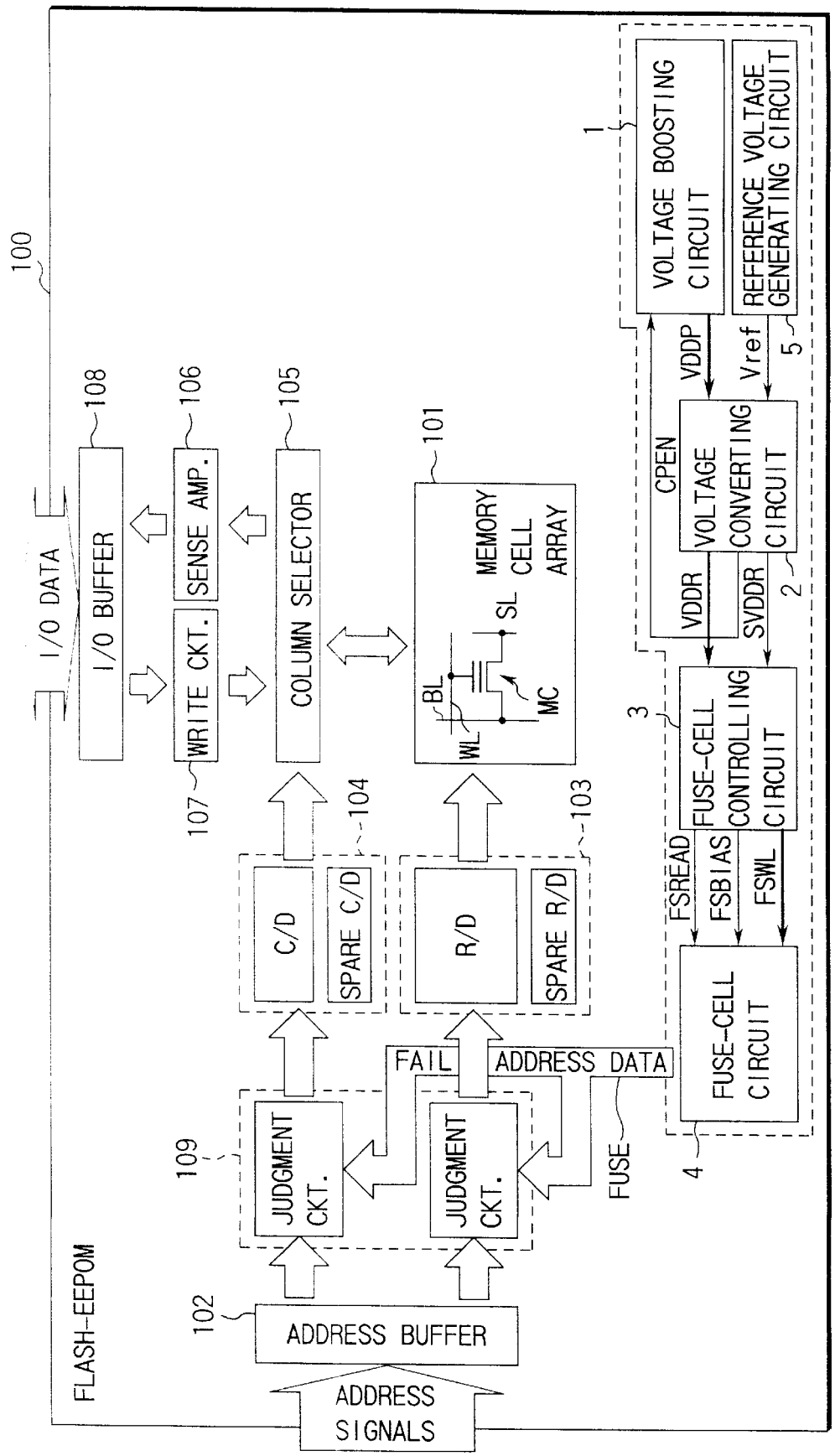
FIG. 17 is a block diagram showing a flash EEPROM to which the present invention can be applied.
Figure 18:
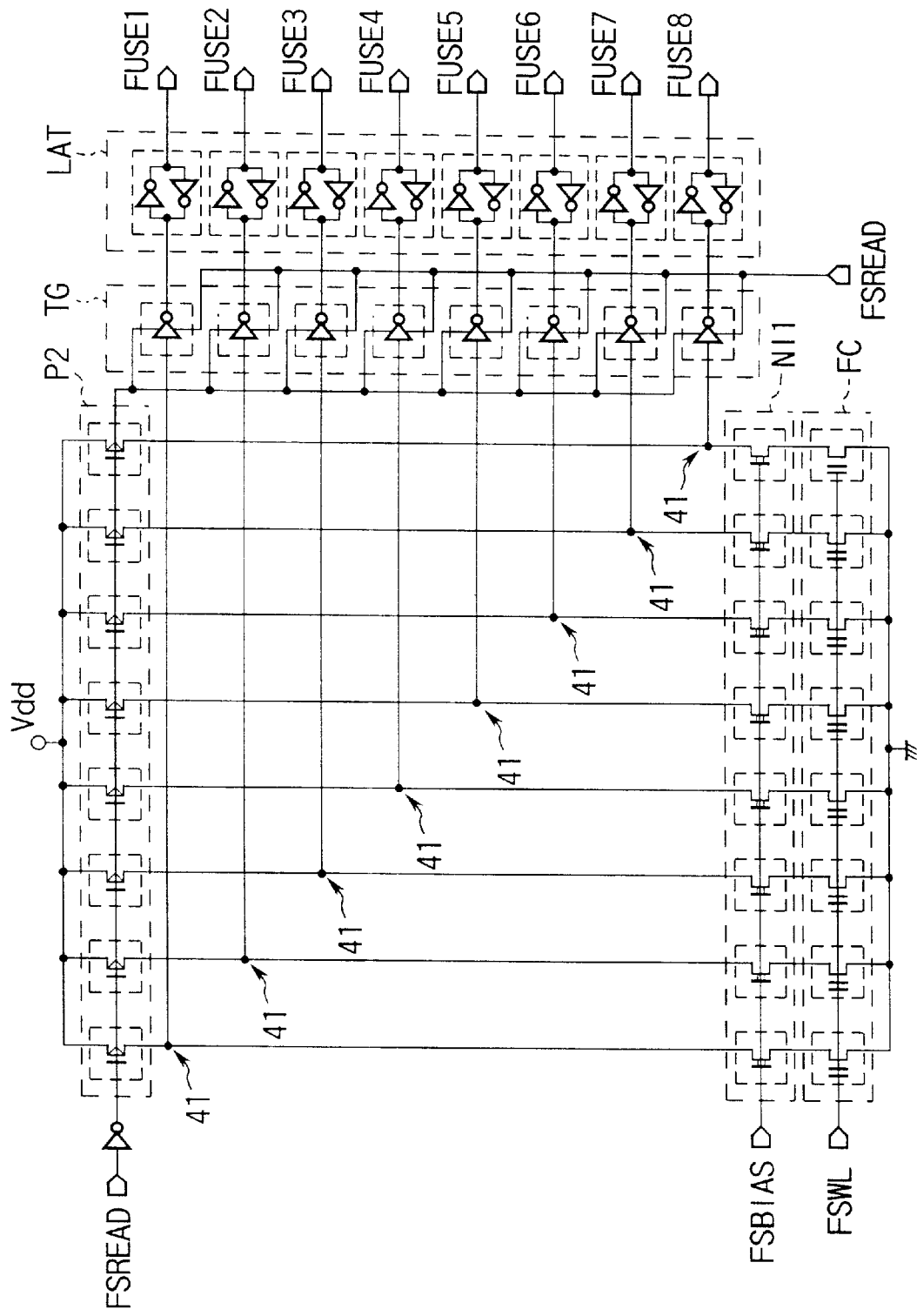
FIG. 18 is a circuit diagram showing an example of a fuse-cell circuit.

FIG. 17 is a block diagram showing an example of the structure of a flash EEPROM to which the present invention can be applied. FIG. 18 is a circuit diagram showing an example of the structure of a fuse-cell circuit.

As shown in FIG. 17, a memory cell array 101 constituted by integrating memory cells MC in a matrix form is formed in a flash EEPROM chip 100.

Each of the memory cells MC integrated in the memory cell array 101 is a nonvolatile memory cell incorporating a floating gate, a control gate, a source and a drain. When electrons are injected into the floating gate, the threshold voltage of the memory cell MC can be changed. The foregoing nonvolatile memory cell MC is the same as the fuse-cell FC and the reference cell REFC. The control gate of the memory cell MC is connected to word line WL, the drain is connected to bit line BL and the source is connected to source line SL.

An address buffer 102 is supplied with an address signal from outside to generate an internal address signal. The internal address signal generated by the address buffer 102 is supplied to a row decoder (R/D) 103 and a column decoder (C/D) 104.

The row decoder 103 selects a word line WL (a row) in response to the internal address signal.

The column decoder 104 selects a bit line BL (a columns) in response to the internal address signal.

A column selector 105 receives an output of the column decoder 104 to electrically connect the selected bit lint BL to a sense amplifier 106 or a writing circuit 107.

A sense amplifier 106 amplifies data read from the selected memory cell MC through the bit line BL during the data reading operation.

When the writing circuit 107 writes data, the writing circuit 107 writes data on the selected memory cell MC though the bit line BL.

An I/O buffer 108 outputs, to the outside, read data output from the sense amplifier 106 when data is read. When data is written, the I/O buffer 108 inputs, to the writing circuit 107, write data input from outside.

In the foregoing flash EEPROM structured as described above, the fuse-cell circuit 4 is used as a circuit for storing so-called redundancy data for substituting a spare column/row for a defective column/row in the memory cell array 101.

The fuse-cell circuit 4 stores defective address data corresponding to the defective column/row. The fuse-cell circuit 4 outputs the stored defective address data (FUSE) to a defective address judgment circuit 109. A specific example of the structure of the fuse-cell circuit 4 is shown in FIG. 18. In the foregoing embodiment, only one fuse-cell FC is illustrated. In actual, a plurality of the fuse-cells FC are provided as shown in FIG. 18 to store many data items. Data items are simultaneously read from the plural fuse-cells FC so as to be latched by the latch circuit LAT. During the usual operation of the apparatus, the latch circuit LAT continuously outputs plural data FUSE (FIG. 18 shows 8-bit data items FUSE1 to FUSE8). In the eighth embodiment, the plural latch circuits LAT outputs 8-bit data FUSE1 to FUSE8 as defective address data.

Defective address data is supplied to the defective address judgment circuit 109. The defective address judgment circuit 109 makes a comparison between the internal address supplied from the address buffer 102 and defective address data. When the internal address and the defective address data coincide with each other, the defective address judgment circuit 109 selects a spare row decoder (a spare R/D) or a spare column decoder (a spare C/D) in place of the normal row decoder (the R/D) or the normal column decoder (C/D). As a result, the spare word line or the spare bit line can be selected in place of the defective normal word line or the defective normal bit line. Thus, a chip having the defective memory cell array 101 can be relieved.

The present invention can be applied to a flash EEPROM structured as shown in FIG. 17.

As a matter of course, the present invention may be applied to another semiconductor memory using the redundancy technique as well as the flash EEPROM structured as shown in FIG. 17.

Data for switching the specification of the chip can be stored in the fuse-cell circuit 4 as well as redundancy data. Data for switching the specification of the chip is exemplified as follows:

(A) Data for switching the number of I/O bits;
(B) Data for instructing a write/erase inhibited block;
(C) Data for switching the position of an external pad to correspond to the package; and
(D) Data for switching top-boot/bottom-boot for determining the block size from which data is erased.

The foregoing types of data items can be stored in the fuse-cell circuit 4.

Data, the use of which is inhibited after a test, may be stored in a built-in test circuit for use in the test of the chip.

As described above, the foregoing data items can be stored in the fuse-cell circuit 4 of the semiconductor memory device according to the present invention as well as redundancy data.

Therefore, the present invention may be applied to another semiconductor memory device, for example, a microprocessor as well as the semiconductor memory.

As described above, according to the present invention, a semiconductor memory device can be provided which is capable of greatly maintaining the difference between the read voltage and the threshold voltages corresponding to data stored in the fuse-cell regardless of change in the power supply voltage and change in the temperature.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a fuse-cell circuit incorporating a fuse-cell;
    a fuse-cell controlling circuit which reading data from the fuse-cell;
    a voltage converting circuit which uses a reference voltage to convert a predetermined input voltage into a read voltage for use when data is read from the fuse-cell; and
    a reference-voltage generating circuit which generating the reference voltage by using a threshold voltage of a device having the same structure as that of the fuse-cell.

2. A semiconductor memory device according to claim 1, further comprising:
    a current converting circuit which converting the level of the reference voltage into another level by performing current conversion.

3. A semiconductor memory device according to claim 1, wherein the voltage converting circuit incorporates a transistor having a gate which receives voltage containing a changed component of the reference voltage so as to regulate the input voltage to the read voltage.

4. A semiconductor memory device according to claim 2, wherein the voltage converting circuit incorporates a transistor having a gate which receives voltage containing a changed component of the reference voltage so as to regulate the input voltage to the read voltage.

5. A semiconductor memory device according to claim 3, wherein the voltage containing the changed component of the reference voltage is any one of (A) to (C) below:
    (A) voltage obtained by amplifying the difference between the reference voltage and the read voltage;
    (B) voltage obtained by current-converting the reference voltage; and
    (C) the reference voltage itself.

6. A semiconductor memory device according to claim 4, wherein the voltage containing the changed component of the reference voltage is any one of (A) to (C) below:
    (A) voltage obtained by amplifying the difference between the reference voltage and the read voltage;
    (B) voltage obtained by current-converting the reference voltage; and
    (C) the reference voltage itself.

7. A semiconductor memory device according to claim 1, further comprising:
    a voltage boosting circuit which boosting an external power supply to a boosted voltage and supplying the boosted voltage to the voltage converting circuit as the input voltage,
    wherein the voltage converting circuit incorporates a detector which stopping a boosting operation of the voltage boosting circuit when the read voltage is raised to a predetermined level.

8. A semiconductor memory device according to claim 2, further comprising:
    a voltage boosting circuit which boosting an external power supply to a boosted voltage and supplying the boosted voltage to the voltage converting circuit as the input voltage,
    wherein the voltage converting circuit incorporates a detector which stopping a boosting operation of the voltage boosting circuit when the read voltage is raised to a predetermined level.

9. A semiconductor memory device according to claim 3, further comprising:
    a voltage boosting circuit which boosting an external power supply to a boosted voltage and supplying the boosted voltage to the voltage converting circuit as the input voltage,
    wherein the voltage converting circuit incorporates a detector which stopping a boosting operation of the voltage boosting circuit when the read voltage is raised to a predetermined level.

10. A semiconductor memory device according to claim 4, further comprising:
    a voltage boosting circuit which boosting an external power supply to a boosted voltage and supplying the boosted voltage to the voltage converting circuit as the input voltage,
    wherein the voltage converting circuit incorporates a detector which stopping a boosting operation of the voltage boosting circuit when the read voltage is raised to a predetermined level.

11. A semiconductor memory device according to claim 5, further comprising:
    a voltage boosting circuit which boosting an external power supply to a boosted voltage and supplying the boosted voltage to the voltage converting circuit as the input voltage,
    wherein the voltage converting circuit incorporates a detector which stopping a boosting operation of the voltage boosting circuit when the read voltage is raised to a predetermined level.

12. A semiconductor memory device according to claim 6, further comprising:
    a voltage boosting circuit which boosting an external power supply to a boosted voltage and supplying the boosted voltage to the voltage converting circuit as the input voltage,
    wherein the voltage converting circuit incorporates a detector which stopping a boosting operation of the voltage boosting circuit when the read voltage is raised to a predetermined level.

13. A semiconductor memory device according to claim 7, wherein the voltage boosting circuit is deactivated after reading of data from the fuse-cell is completed.

14. A semiconductor memory device according to claim 8, wherein the voltage boosting circuit is deactivated after reading of data from the fuse-cell is completed.

15. A semiconductor memory device according to claim 9, wherein the voltage boosting circuit is deactivated after reading of data from the fuse-cell is completed.

16. A semiconductor memory device according to claim 10, wherein the voltage boosting circuit is deactivated after reading of data from the fuse-cell is completed.

17. A semiconductor memory device according to claim 11, wherein the voltage boosting circuit is deactivated after reading of data from the fuse-cell is completed.

18. A semiconductor memory device according to claim 12, wherein the voltage boosting circuit is deactivated after reading of data from the fuse-cell is completed.

* * * * *